United States Patent
Heremans et al.

(10) Patent No.: US 6,504,180 B1
(45) Date of Patent: Jan. 7, 2003

(54) METHOD OF MANUFACTURING SURFACE TEXTURED HIGH-EFFICIENCY RADIATING DEVICES AND DEVICES OBTAINED THEREFROM

(75) Inventors: Paul Heremans, Leuven (BE); Maarten Kuijk, Antwerpen (BE); Reiner Windisch, Leuven (BE); Gustaaf Borghs, Kessel-Lo (BE)

(73) Assignees: IMEC vzw and Vrije Universiteit, Leuven (BE); Bruseel, Brussels (BE)

( * ) Notice: Subject to any disclaimer, the term of this patent is extended or adjusted under 35 U.S.C. 154(b) by 0 days.

(21) Appl. No.: 09/360,505

(22) Filed: Jul. 26, 1999

Related U.S. Application Data

(60) Provisional application No. 60/110,322, filed on Nov. 30, 1998, and provisional application No. 60/131,358, filed on Apr. 28, 1999.

(30) Foreign Application Priority Data

| Jul. 28, 1998 | (EP) | 98870164 |
| Oct. 30, 1998 | (EP) | 98870233 |
| Nov. 13, 1998 | (EP) | 98870252 |

(51) Int. Cl.$^7$ .............................................. H01L 33/00
(52) U.S. Cl. .............................. 257/98; 257/95; 257/88
(58) Field of Search .............................. 257/95, 98, 99, 257/88; 372/45, 46, 49

(56) References Cited

U.S. PATENT DOCUMENTS

| 3,739,217 A | 6/1973 | Bergh et al. ............ 313/108 R |
| 4,080,245 A | 3/1978 | Yamanaka et al. .......... 156/647 |
| 4,297,651 A | 10/1981 | Dyment et al. ............... 372/45 |

(List continued on next page.)

FOREIGN PATENT DOCUMENTS

EP 0 404 565 6/1990

OTHER PUBLICATIONS

R. Windisch, et al. Systematic photoluminescence and electroluminescence study of high–efficiency surface–textured thin–film light emitting structures. Institut fur Technische Physik I, Erlangen, Germany. pp. 94–103. –1998.

(List continued on next page.)

*Primary Examiner*—Minh Loan Tran
(74) *Attorney, Agent, or Firm*—Knobbe, Martens, Olson & Bear, LLP

(57) ABSTRACT

A device for emitting radiation at a predetermined wavelength is presented. This device has a cavity with an active layer in which said radiation is generated by charge carrier recombination. The edges of the device define the region or space for radiation and/or charge carrier confinement. At least one of the edges of this cavity has a substantially random grating structure. The edge of the device has substantially random grating structure and can extend as at least one edge of a waveguide forming part of this radiation emitting device. The radiation emitting device of the present invention can have a cavity comprising a radiation confinement space that includes confinement features for the charge carriers confining the charge carriers to a subspace being smaller than the radiation confinement space within the cavity. The emitting device can comprise at least two edges forming, in cross-section, a substantially triangular shape. The angle between these two edges is smaller than 45°. At least one of the two edges has a transparent portion. the devices according to the present invention can be arranged in arrays.

50 Claims, 30 Drawing Sheets

U.S. PATENT DOCUMENTS

| | | | | |
|---|---|---|---|---|
| 4,407,695 | A | | 10/1983 | Deckman et al. ............ 156/643 |
| 4,554,727 | A | | 11/1985 | Deckman et al. ............. 29/572 |
| 4,664,748 | A | | 5/1987 | Ueno et al. .............. 156/659.1 |
| 4,801,476 | A | | 1/1989 | Dunsmuir et al. ........ 427/430.1 |
| 4,894,835 | A | * | 1/1990 | Uomi et al. ................... 372/45 |
| 5,087,949 | A | | 2/1992 | Haitz ........................... 257/95 |
| 5,226,053 | A | | 7/1993 | Cho et al. ..................... 372/45 |
| 5,300,788 | A | | 4/1994 | Fan et al. ...................... 257/13 |
| 5,349,211 | A | | 9/1994 | Kato ........................... 257/90 |
| 5,358,880 | A | * | 10/1994 | Lebby et al. ................. 372/45 |
| 5,510,156 | A | | 4/1996 | Zhao .......................... 427/534 |
| 5,705,834 | A | | 1/1998 | Egalon et al. ................ 257/95 |
| 5,776,644 | A | | 7/1998 | Clerc et al. ..................... 430/8 |

OTHER PUBLICATIONS

I. Schnitzer, et al. 30% external quantum efficiency from surface textured, thin–film light–emitting diodes. Applied Physics Letter. pp 2174–2176. Oct. 18, 1993.

B. Weigl, et al. High–power single–mode selectively oxidized vertical–cavity surface–emitting lasers. IEEE Photonics Technology Letters. pp 971–973. Aug., 1996.

M.R. Krames, et al., High–power truncated–inverted–pyramid $(Al_xGa_{1-x})_{.5}In_{.5}P$/GaP light–emitting diodes exhibiting > 50% external quantum efficiency. Hewlett Packard Laboratories. No date.

C. Haginoya, et al. Nanostructure array fabrication with a size–controllable natural lithography. Applied Physics. pp 2934–2936. Nov. 17, 1997.

European Patent Office. Partial European Search Report (EP 98 87 0252). Mar. 5, 1999.

* cited by examiner

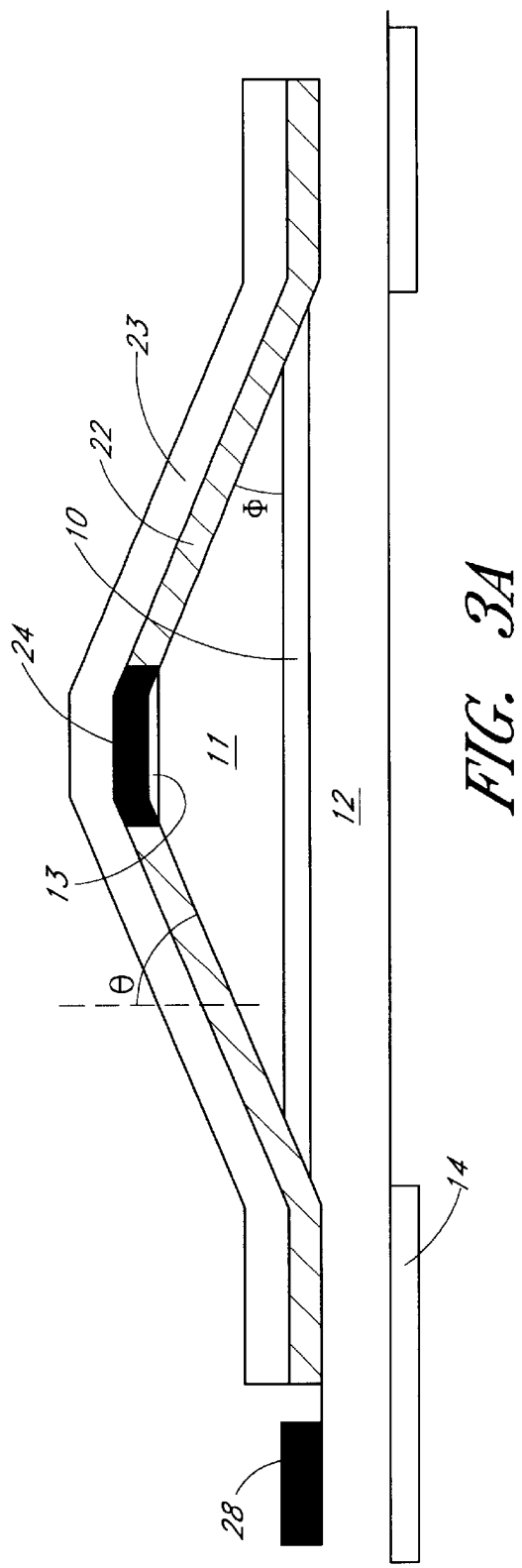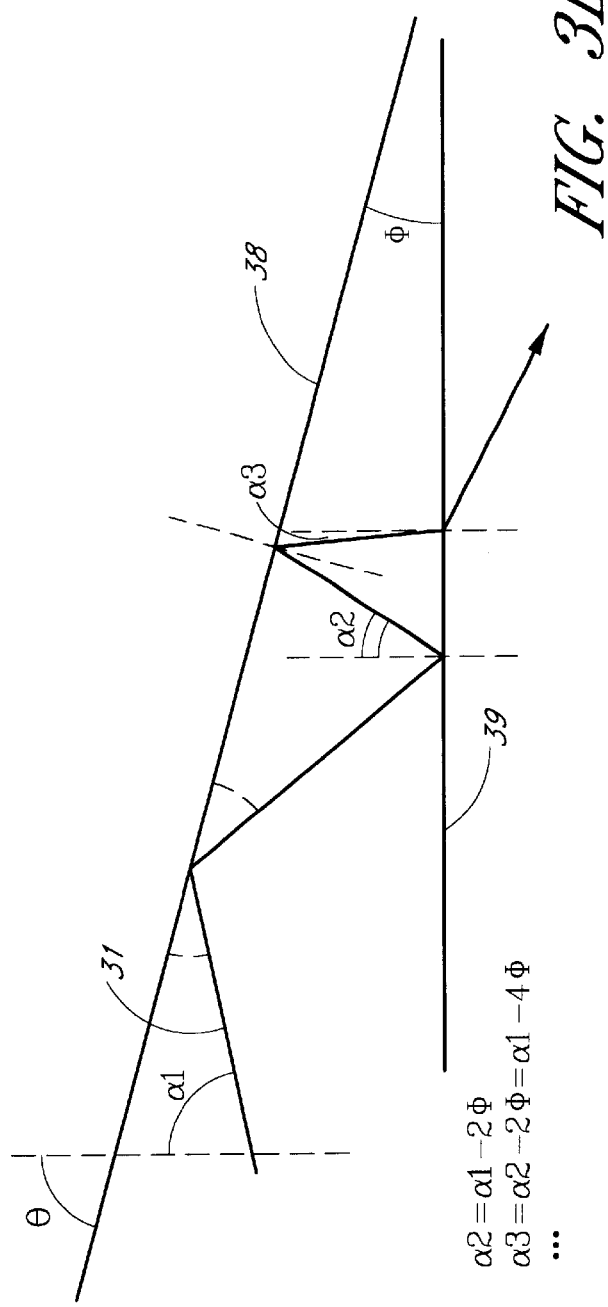

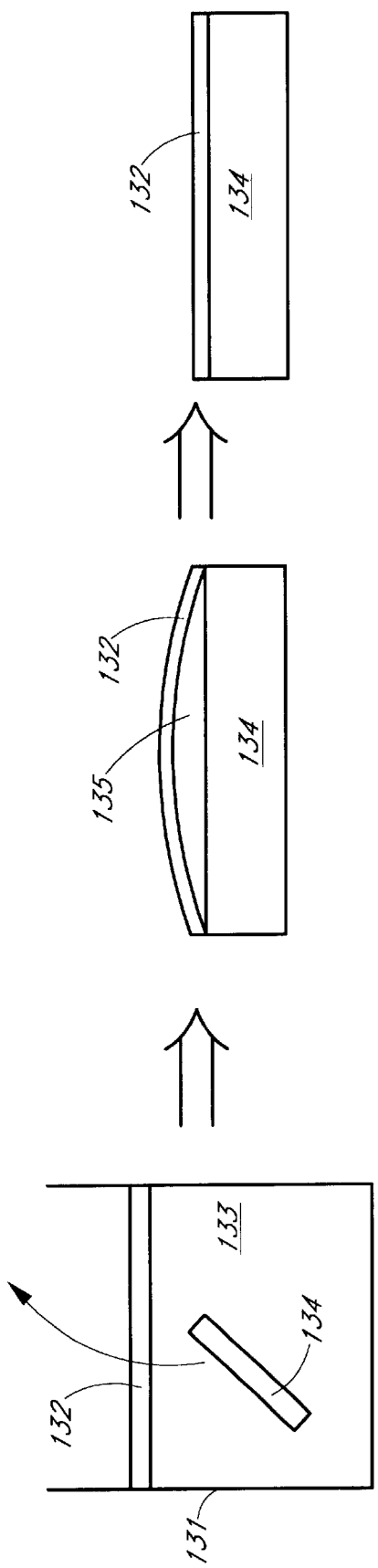
(131) beaker
(132) monolayer of polystyrene spheres
(133) water
(134) sample
(135) water film

METHOD OF MANUFACTURING SURFACE TEXTURED HIGH-EFFICIENCY RADIATING DEVICES AND DEVICES OBTAINED THEREFROM

This application claims the benefit of priority under 35 U.S.C. §119(e) from U.S. Provisional Application No. 60/110,322, filed on Nov. 30, 1998, U.S. Provisional Application No. 60,131,358 filed Apr. 28, 1999. This application also claims the benefit of priority from EPO Application EP 988701645 filed Jul. 28, 1998, EP 988702338 filed Oct. 30, 1998 and EP 988702528 filed Nov. 13, 1998.

FIELD OF THE INVENTION

The present invention is related to the field of radiation emitting devices. More in particular semiconductor devices that emit light at a predetermined wavelength with a high efficiency are disclosed. A method of making such devices and applications of the devices are also disclosed.

BACKGROUND OF THE INVENTION

Semiconductor devices that can emit non-coherent or coherent light are known in the art. A number of publications on semiconductor based light emitters deals with Light Emitting Diodes (LEDs) or Microcavity LEDs or Microcavity Lasers or Vertical Cavity Surface Emitting Lasers. Examples of such publications are:

H. De Neve, J. Blondelle, R. Baets, P. Demeester, P. Van Daele, G. Borghs, IEEE Photon. Technol. Lett. 7 287 (1995);

E. F. Schubert, N. E. J. Hunt, R. J. Malik, M. Micovic, D. L. Miller, "Temperature and Modulation Characteristics of Resonant-Cavity Light-Emitting Diodes", Journal of Lightwave Technology, 14 (7), 1721–1729 (1996);

T. Yamauchi and Y. Arakawa, Enhanced and inhibited spontaneous emission in GaAs/AlGaAs vertical microcavity lasers with two kinds of quantum wells. Appl. Phys. Lett. 58 (21), 2339 (1991);

T. J. de Lyon, J. M. Woodall, D. T. McInturff, R. J. S. Bates, J. A. Kash, P. D. Kirchner, and F. Cardone, "Doping concentration dependence of radiance and optical modulation bandwidth in carbon-doped $Ga_{0.1}In_{0.49}P/GaAs$ light-emitting diodes grown by gas source molecular beam epitaxy" Appl. Phys. Lett. 60 (3), 353–355 (1992);

D. G. Deppe, J. C. Campbell, R. Kuchibhotla, T. J. Rogers, B. G. Streetman, "Optically-coupled mirror-quantum well InGaAs-GaAs light emitting diode", Electron. Lett. 26 (20), 1665 (1990);

M. Ettenberg, M. G. Harvey, D. R. Patterson, "Linear, High-Speed, High-Power Strained Quantum-Well LED's", IEEE Photon. Technol. Lett. 4 (1), 27 (1992);

U.S. Pat. No. 5,089,860 Deppe, et. al. Feb. 18, 1992, "Quantum well device with control of spontaneous photon emission, and method of manufacturing same".

It is known in the art that the light emission from an electroluminescent device or from a light emitting semiconductor diode (a LED) is limited by the total interal reflection occurring at the interface between the semiconductor substrate wherein the device is fabricated and the surrounding medium. Mostly emission of the light to air, with refractive index of unity, is intended. The semiconductor typically has a refractive index $n_s$ of 3 to 4. GaAs, for example, has a refractive index $n_s=3.65$. Snell's law determines that only photons arriving at the semiconductor-air interface with an angle smaller than a critical angle $\theta_c=\arcsin(1/n_s)$ can escape to the air. All other photons are totally reflected at the semiconductor-air interface, and therefore remain in the semiconductor substrate, until eventually they are re-absorbed. For GaAs, the critical angle for total internal reflection is 16 degrees. Hence, total internal reflection limits the number of photons escaping the semiconductor substrate to those photons arriving at the semiconductor-air interface with an angle of less than 16 degrees. Only about 2% of the photons generated inside the semiconductor comply with this condition.

Several prior-art inventions propose to increase the escape probability of photons generated in the LED. In microcavity light-emitting diodes, such as described for example by Cho et al. in U.S. Pat. No. 5,226,053, the active layer of the light emitting device is placed in a microcavity. The cavity influences the emission of the photons: more photons are generated with an angle smaller than the critical angle $\theta_c$. In this way, efficiencies of 15% and more have been achieved.

A second way to increase the efficiency of LEDs is to re-absorb photons which cannot escape from the semiconductor. If re-absorption occurs in the active layer of the LED, there is a chance that the electron-hole pair generated during re-absorption will recombine radiatively again, and re-emit a photon. Again, 2% of these photons will escape, and the remainder part can be re-absorbed. The phenomenon of multiple re-absorption and re-emission has been shown to result in efficiencies of the order of 10% in normal LEDs, and also to boost the efficiency of certain microcavity LEDs up to 23%. The problem with this technique is that it is inherently slow, because one has to wait for multiple re-absorptions and re-emissions.

A third way is to shape the semiconductor surface of the light emitting devices such that more of the generated rays reach the semiconductor-air interface within the critical angle. The optimum shape for the semiconductor-air surface is a hemisphere, where the light-emitting area is confined to a small spot at the centre of the hypothetical full sphere from which the hemisphere is taken. Other shapes have been proposed. In U.S. Pat. No. 5,087,949, Haitz proposes a structure which is more practical to make than a hemisphere, namely a set of V-groves in the substrate that are created such that the normal to the V-grove facets are oriented substantially perpendicularly to the light-emitting region. Kato, in U.S. Pat. No. 5,349,211, proposes a structure where the sidewalls or edges of the substrate are shaped such that some of the photons that are reflected from the regular light-output interface are emitted through these sidewalls. Egalon and Rogowski propose a sidewall shape for the substrate (rather than only for the mesa) that redirects some of the photons to angles that can escape through the regular light-output surface. All these proposed structures assume that the LED substrate is fairly thick and transparent for the photons emitted by the diode.

According to the teaching of U.S. Pat. No. 5,087,949 by Yamanaka et al. light emitting devices with a cavity having a truncated polyhedral pyramid shape are created. The lateral edges or facets of the devices have an angle of preferentially 45 degrees. Photons that are generated in a direction parallel to the light-output surface (edge) are reflected by the mesa edge of such cavity into a direction which is substantially perpendicular to the light-output surface, and hence more photons can escape from the cavity.

A fourth way to increase LED efficiency is to provide device structures capable to redirect a photon more than once before the photon is re-absorbed. This goal is achieved by providing surface edges of the device that contain surface portions having angles different from the main semiconductor substrate-air interface. Every time a photon hits such a surface, it is redirected to a new propagation angle. In this way, photons travelling in a direction that is not favourable for emission to the air have a certain probability be redirected in a favourable angle after a number of reflections at such surface. In U.S. Pat. No. 3,739,217, Bergh and Saul propose to create topographic irregularities at the light-emitting surface or at the opposite (light-reflecting) surface of a LED which has a transparent substrate. Noguchi et al. in EP-A-0404565 propose to texture the sidewalls or edges of the substrate wherein the light emitting device is made.

The previously described methods apply to light-emitting devices where the light is emitted through the substrate. Therefore, the light-emitting devices need to be fabricated in a transparent substrate. The teaching of the patents of Noguchi et al., Egalon et al., and Kato et al. can only be applied to single light-emitting devices, but not to light-emitting devices in arrays. The invention disclosed by Haitz et al. (U.S. Pat. No. 5,087,949) can be applied to arrays, but it requires the presence of a fairly thick substrate, and the spacing of the light-emitting devices of an array should be of the order of the substrate thickness.

A method for manufacturing light-emitting devices the substrate of which does not have to be transparent is proposed in U.S. Pat. No. 5,358,880, by Lebby et al. The invention includes replacing the original substrate, which can be non-transparent, by a transparent conductive layer such as Indium Tin Oxide and a clear epoxy plus glass-like host substrate. Further, the disclosed invention aims to make a closed cavity, by etching through the active layer of the light emitting device, and covering the sides of the etched mesa with a dielectric material and a metal. In this way, photons that cannot escape through the transparent window are kept in the cavity by multiple reflections, re-absorbed and eventually re-emitted.

When applied to for instance a material system like GaAs, InAs, or AlAs and combinations thereof, the inventions mentioned above can only be used for light-emitting devices with a large diameter. This is because these prior art inventions rely on etching through the active layer of the light-emitting device. When doing so in a material with a large surface recombination velocity like GaAs, one triggers a severe parasitic surface recombination current. Surface recombination is a phenomenon of two charge carriers of opposite type, an electron and a hole, recombining at a trap, e.g. at the surface of the material, without emitting light. The velocity of recombination is proportional to the number of available traps and to the density of charge carriers available for recombination. The surface of III-V semiconductors like GaAs has a large number of traps, about $10^{14}$ cm$^{-2}$. Hence, the surface recombination velocity is very large. Thus there is a problem of making highly efficient light emitting devices as the recombination losses of the charge carriers decrease the efficiency of the total light emission of the devices. One solution is to inject electrons and holes from electrodes that are physically at a large distance from the free surface (edge), which usually coincides with the cleavage surface of the device. Because of the necessity of having a large distance between the edge of the device and the contact, the resulting device is necessarily large, typically at least several hundred microns in diameter. Such devices therefore are not suitable for integration in large arrays. Also, their large area results in a large capacitance, and therefore slow operation.

Thus the prior art fails to disclose highly efficient light-emitting devices that can be integrated as small devices in a dense array of light emitting devices.

High efficiency LEDs are required for applications such as optical communication. Optical communication replaces electrical communication in many areas, because it can provide longer distance interconnects for a given energy budget. The minimum distance over which optical interconnects are advantageous over electrical interconnects can be quite short, e.g. a few centimeters. The energy consumption necessary for a given data bandwidth is a critical factor deciding on the minimum distance over which optical interconnects are competitive over electrical interconnects. The bandwidth transmitted by an optical interconnect system is the product of the serial bandwidth per interconnect channel with the number of parallel optical channels. Optics have the advantage over electrical interconnects that the number of channels can be much larger. One of the conditions to be able to access this potential massive parallelism, is that the power consumption per channel remains small: the heat dissipation has to remain manageable. Therefore high efficiency LEDs that can be integrated in dense arrays are needed.

AIMS OF THE INVENTION

The present invention aims to disclose radiation, preferably light, emitting devices with a high radiation emission efficiency. The invention further aims at disclosing radiation, preferably light, emitting devices that can be fabricated as small devices in an array of such devices.

According to an aim of the invention the radiation, preferably light, emitting devices can be placed in dense arrays.

According to another aim of the invention the outcoupling efficiency of radiation, preferably light, emitting devices is improved, which leads to a reduced power consumption for a given radiation output power.

According to yet another aim of the invention, the speed of the radiation, preferably light, emitting devices is increased, hence the serial bandwidth per optical channel is increased. The invention further aims to disclose light emitting devices that exhibit uniform radiation emission characteristics.

According to yet another aim of the invention, light-emitting devices are disclosed having a low-resistance contact path. In this way a high wall-plug efficiency is achieved. Hereto in inventive embodiments of the invention, electrical contacts are foreseen through at least one hole in a mirror side of the light-emitting device. In such embodiment, the mirror preferably is not conductive.

The light emitting devices that are disclosed can be used in parallel optical interconnects. The light emitting devices according to the invention can be placed in dense arrays. The light outcoupling efficiency is strongly improved, which leads to a reduced power consumption for a given optical output power. Third, the speed of the devices is increased, hence the serial bandwidth per optical channel is increased.

The features of the devices (diodes) of the present invention can be applied for a multitude of light emitting devices such as high-efficiency LEDs or microcavity LEDs.

The light emitting devices (diodes) of the present invention can be used for applications wherein two-dimensional LED arrays, particularly low-power arrays, are useful, such as in display technology. Active matrix displays relying on liquid crystals (e.g. integrated on CMOS circuitry) could be replaced by LED arrays. Dense and bright one-dimensional LED arrays are useful for example for printing and copying applications.

Also for single LED applications it is important to have a maximum of photons escaping from the light emitting surface. Firstly, the intensity of light per unit area (the brightness) is larger, and this is useful in many applications. Furthermore, the packaging cost can be reduced. Indeed, in order to achieve a large global efficiency, many conventional LEDs need an elaborate package that includes a cavity with mirrors, because the light is emitted from more than one surface of the LED.

SUMMARY OF THE INVENTION

In an object of the present invention radiation, preferably light, emitting devices and methods of making such devices are disclosed that have a high radiation emission efficiency. According to this aspect of the invention the outcoupling efficiency of radiation, preferably light, emitting devices is improved, which leads to a reduced power consumption of the devices for a given radiation output power.

In another object of the present invention radiation, preferably light, emitting devices and methods of making such devices are disclosed that can be fabricated as small devices in an array of such devices.

The radiation, preferably light, emitting devices of the present invention can have an increased speed performance, hence the serial bandwidth per optical channel is increased. The radiation, preferably light, emitting devices of the present invention can exhibit uniform radiation emission characteristics.

For the purpose of this patent application a number of terms are defined herebelow. A cavity of a radiation emitting device is the space within the device containing the active layer of the device and being enclosed by edges, at least one of the edges having reflective characteristics. The space furthermore has at least one window or transparent edge such that photons with a predetermined wavelength or within a predetermined wavelength band can escape through this window. The active layer of the radiation-emitting device is the region of the device wherein the charge carriers of the device, for instance electrons and holes, meet for creating radiation (light). Mesa edges are the edges of radiation emitting devices that are defined by etching structure in or growing structure upon a substrate. Typically a device with mesa edges has a table-like or truncated-pyramid-like shape. The term edge in this patent application is to be understood as a sidewall or a surface or a delimiting surface of the devices of the invention. A predetermined wavelength of course is to be understood as including a limited wavelength band around said predetermined wavelength. With the term confined through form and functioning it is meant that without additional means or without additional structural features such as extended, large isolation features in an array of devices, each of the devices in an array of devices can be addressed individually via the connection for electrical signals. Such confinement through form and functioning can be done e.g. when said devices are being integrated in a single thin film semiconductor.

In a first aspect of the present invention, a device for emitting radiation at a predetermined wavelength is disclosed. Said device is mounted on a carrier substrate, said carrier substrate being transparent for said radiation and preferably including a fiber optic face plate. This allows for denser arrays, because otherwise the pitch of an array of devices is limited by the glass thickness. The device can have the edge being transparent for said radiation having a roughened reflective surface condition. Also an edge being transmissive for said radiation can have a roughened surface condition. In a preferred embodiment of the invention, the roughened surface condition is present as a substantially random diffraction grating structure.

In a second aspect of the present invention, a device for emitting radiation at a predetermined wavelength is disclosed, said device having a cavity with an active layer wherein said radiation is generated by charge carrier recombination, said cavity comprising at least one edge having a substantially random grating structure. The edges of the device define the region or space for radiation and/or charge carrier confinement. Said edge having a substantially random grating structure can extend as at least one edge of a waveguide forming part of said device. The radiation emitting device of the present invention can have a cavity comprising a radiation confinement space that includes confinement features for said charge carriers confining said charge carriers to a subspace being smaller than the radiation confinement space within said cavity. The waveguide forming part of the device can according to such embodiment of the invention be the region of radiation confinement of the device that is larger than the electrical confinement region. The edge of the device extending as a waveguide forming part of said device and having a substantially random partially reflective grating structure can also abut said active layer or extend in said active layer. Thus a way to avoid photons escaping by guided modes from the mesa area is disclosed. One of the edges of the cavity of the device can be a mesa edge. According to another preferred embodiment of the invention the region where charge carriers meet for creating radiation (the active layer) has none or substantially none free surface or edge where surface recombination can take place. Thus the radiation emitting device of the present invention can have a cavity comprising a radiation confinement space that includes confinement features for said charge carriers confining said charge carriers to a subspace being smaller than the radiation confinement space within said cavity. The device according to this aspect of the invention can have a cavity comprising at least one mesa edge for defining said radiation confinement space and said device can further comprise a ring of a dielectric material in said cavity. Thus according to this preferred embodiment of the present invention, the devices are optically and electrically confined and the electrical confinement space is a subspace of the optical confinement space. The devices according to this embodiment of the present invention can be confined in form and functioning without additional means or without additional structural features such as extended, large isolation features in the device. The device can operate while strongly reducing the recombination effects of charge carriers in said device. Such confinement in form and functioning can be done e.g. when said devices are being integrated in a single thin film semiconductor. In preferred embodiments of the invention, the confinement in form and functioning is done by a double mesa edge. The electrical confinement of the devices of the invention to a space that is a subspace of the optical confinement space can be achieved by the presence of a ring of dielectric material in the cavity of the device. The double mesa edge can comprise a first mesa edge above a second mesa edge wherein the active layer of said device is located. The device can also have an active layer that is located above a ring of a dielectric material in said cavity. Also double mesas are disclosed that include an isolation plus metal coating on the mesa edges. Such is important for reducing the surface recombination in small radiation emitting devices. A combination of single mesas with oxidised aperture is also disclosed. The surfaces or edges of the cavity can be textured or roughened. This texturing can be smaller or larger than the wavelength of the radiation and can be a substantially random grating structure pattern. The texturing or roughening adds to more scattering of photons inside the cavity, and therefore again improves the efficiency and the speed of the devices.

The devices of the present invention do not rely on a resonance for their operation, and their performance is not critical impacted by variations in growth and process. They are therefore suitable for integration into large arrays. Furthermore, they exhibit high efficiency characteristics, in particular at high speed.

In a third aspect of the present invention, an array of devices is disclosed, wherein individual devices of said array are being confined in form and functioning. At least one of the edges of the devices of the array can have a substantially random grating structure and at least one edge can extend as a waveguide forming part of said device. The radiation emitting devices of the array can have a cavity comprising a radiation confinement space that includes confinement features for said charge carriers confining said charge carriers to a subspace being smaller than the radiation confinement space within said cavity. The grooves inbetween the individual devices of the array can have a substantially random diffraction grating structure. The array of devices can have a single electrical anode contact and a single electrical cathode contact. The devices of the array can be thinned and be mounted on a carrier substrate. A microlense or microlense array can be positioned on the array of light emiting devices to enhance the light output efficiency and optimize the beam profile.

In a fourth aspect of the present invention, a radiation emitting device is disclosed wherein said device has a cavity wherein said radiation is generated, and said device can comprise at least two adjacent or abutting edges of said cavity forming in cross-section a substantially triangular shape and the angle between said edges being smaller than 45 degrees and at least one of said edges having a transparent portion. In an embodiment the two edges can be adjacent or abutting one to another and one of the edges is transparent and the other is reflective. The non-transparent edge can be a mesa edge. Also the transparent edge can be a mesa edge. Thus the edges or one of the edges can extend essentially throughout the whole thickness of the device, the thickness of the device being measured between the mesa edge and the transparent window edge. The edges can have a roughened surface condition. In a preferred embodiment of this aspect of the invention, the mesa edge is tapered with angles $\geq 45$ degrees. In this way, not only photons having one specific direction get out. Also, the photons get out after fewer passes, and less re-combination and re-emission occurs. Therefore, a higher speed performance of the device is achieved.

In a fifth aspect of the present invention, a thin-film light emitting device has a reflective edge such as a metal mirror, preferably dielectric-coated, and an electrical contact is provided through this reflective edge or mirror. The carrier substrate can be located at the mirror side of the thin-film semiconductor device, and light can escape through the opposite side. The carrier substrate can be electrically conductive. It can also be a heat-sink for the LED. Thus according to this fifth aspect of the present invention, light-emitting devices are disclosed having a low-resistance contact path. In this way a high wall-plug efficiency is achieved. Hereto, electrical contacts are foreseen through at least one hole in a mirror side of the light-emitting device. In such embodiment, the mirror preferably is not conductive.

The features of the above-described aspects of the invention can be combined in any way to achieve a very efficient device for emitting radiation at a predetermined wavelength.

In a sixth aspect of the present invention, a method for texturing at least a part of at least one surface of a substrate is disclosed. The method comprises the steps of applying preferably substantially randomly an overlayer material covering part of said surface, said overlayer material having a pattern with substantially random distributed open features; and etching said surface while using said overlayer material as an etching mask, said mask thereby containing a substantially random masking pattern. The pattern of the overlayer material with substantially random distributed open features can have any configuration or shape. It can comprise holes therein said holes being randomly distributed. The holes can also partly overlap one another. The substantially random masking pattern can comprise regular repetitions of random subpatterns.

The step of applying said overlayer material with substantially random distributed open features can include the substeps of applying a layer of photoresist material and illuminating said photoresist material with a lithography mask having a substantially random masking pattern and thereafter developing said photoresist. The developed photoresist forms then an overlayer material with substantially random distributed features. UV, deep-UV, x-ray, electron-beam or any type of lithography can be used to illuminate the photoresist. The mask can be a metal mask for a contact aligner or a stepper. It can also be generated as a specular noise pattern of a coherent light source such as a laser.

The method can also comprise the steps of applying a substantially random distribution of particles on said surface; reducing the size of said particles; and thereafter etching said surface while using said particles as an etching mask. Thus it means that the etching techniques that are used are not degrading the particles or that the particles are such that the particles are resistant against the etchants used or have undergone a treatment for making the particles resistant against the etchants used.

The etching step can be to roughen said surface, said surface thereby being rendered diffusive for electromagnetic radiation impinging on said surface. The etching step can comprises the step of etching pillars in said substrate. In a preferred embodiment of the invention, said particles are applied in a monolayer 2-dimensional partial coverage of said surface. The applied partial coverage can be about 60% of the surface and after the size reduction of the particles yielding a coverage of about 50% of the surface.

The method can further comprise the steps of applying a layer of a second masking material on said surface; developing a pattern in said second masking material while reducing the size of said particles; and thereafter etching said surface while using said pattern as an etching mask.

In a seventh aspect of the invention, the method can further comprise the steps of preparing in said substrate a device for emitting radiation at a predetermined wavelength, said device having a cavity, said surface being at least a part of one of the edges of the cavity of the device. According to this aspect of the invention, the reduced size of said particles can be in a range of 50% to 200% of the wavelength of said radiation in the substrate. The edge of the device having a roughened surface condition can be a transmissive and can be a reflective edge of the device. The devices of the first, second and third aspect of the invention can have edges that are roughened according to this method. The roughened edges have then a substantially random diffraction grating structure.

Any of the embodiments of the devices or methods according to the different aspects of the invention can be combined in order to achieve advantageous light-emitting devices.

BRIEF DESCRIPTION OF THE DRAWINGS

FIGS. 3a and 3b show preferred embodiments of light-emitting diodes with slanted mesa edges having angles of more than 45 degrees with respect to the normal to the main semiconductor surface.

FIGS. 13(a)–13(d), 14(a), 14(b), 15, 16 show aspects of the best mode process flow for fabricating devices according to the invention.

DETAILED DESCRIPTION OF THE PRESENT INVENTION

For the purpose of teaching of the invention, preferred embodiments of the method and devices of the invention are described in the sequel. It will be apparent to the person skilled in the art that other alternative and equivalent embodiments of the invention can be conceived and reduced to practice without departing form the true spirit of the invention, the scope of the invention being limited only by the appended claims.

Figure 1A:
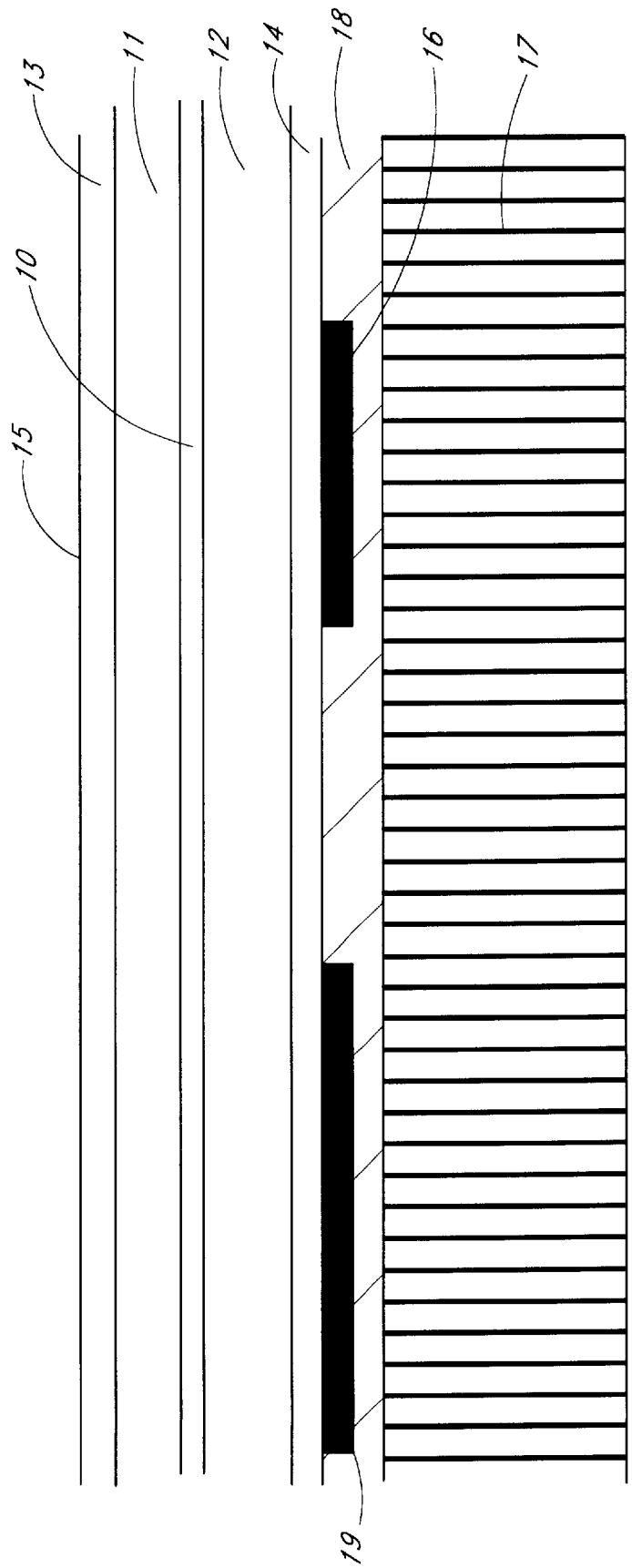
FIG. 1a shows the layer structure of a light-emitting diode according to an embodiment of a device of the present invention.

FIG. 1a shows the layer structure of a light-emitting diode (LED) according to an embodiment of a device of the present invention. This layer structure will be assumed for the devices disclosed in this detailed description of the invention. A layer structure is shown and the layers are made in semiconductor material, preferably III-V semiconductor material and the different layers can be made of different semiconductors. The layers can be epitaxially grown or can be deposited on a substrate. The substrate whereon the layers are made is removed and the layer structure is deposited on a carrier substrate 17. The carrier substrate can be transparent. In an alternative embodiment the layer structure is first deposited on the substrate and thereafter the original substrate is removed. An active layer 10 is surrounded by cladding layers 11 and 12, and by heavily doped contact layers 13 and 14. Layers 11 and 13 have the same doping type, and so have layers 12 and 14. The doping type of layers 11 and 13 is opposite to that of layers 12 and 14, such that both types of charge carriers, electrons and holes, can be injected into the active layer when a suitable bias is applied between layer 13 and 14. The bandgap energy of the material wherein the layers 11 and 12 are made is usually larger than the energy of the photons emitted in the active layer. Hence, absorption of generated photons is limited to the thin contact layers, and to absorption at the surfaces of 15 and 16 of the contact layers. The total film thickness of the semiconductor structure consisting of layers 10, 11, 12, 13 and 14 is thin, typically 0.5 to 5 microns, and therefore these LEDs are referred to as thin-film LEDs. To support the thin semiconductor film, it is attached to a transparent carrier 17. The preferred carrier is a fiber optic face plate rather than a glass plate. The preferred means for attachment is a thermally stable and transparent epoxy 18, such as EPO-TEK 353ND from EPOXY Technologies, or a transparent polyimide. To avoid that the current in the LED has to be carried to the active layer only by lateral flow through layers 12 and 14, which would result in a prohibitive series resistance, part of the surface 16 is covered by a metal layer 19. This metal layer serves as contact layer to the semiconductor layer 14 and at the same time as low-resistance conduction layer for the current. The metal sheet has openings for the light output. Methods for creating a structure that consists of a thin semiconductor film attached to a host substrate can be found in literature. For example, the co-pending patent application EP-98870164.5 filed Jul. 28, 1998, incorporated herein by reference, discloses a suitable process. U.S. Pat. No. 5,358,880 describes another suitable process.

The layer structure of FIG. 1a can be made according to the teaching of patent application EP-98870099.3 which is incorporated herein by reference.

Figure 1B:
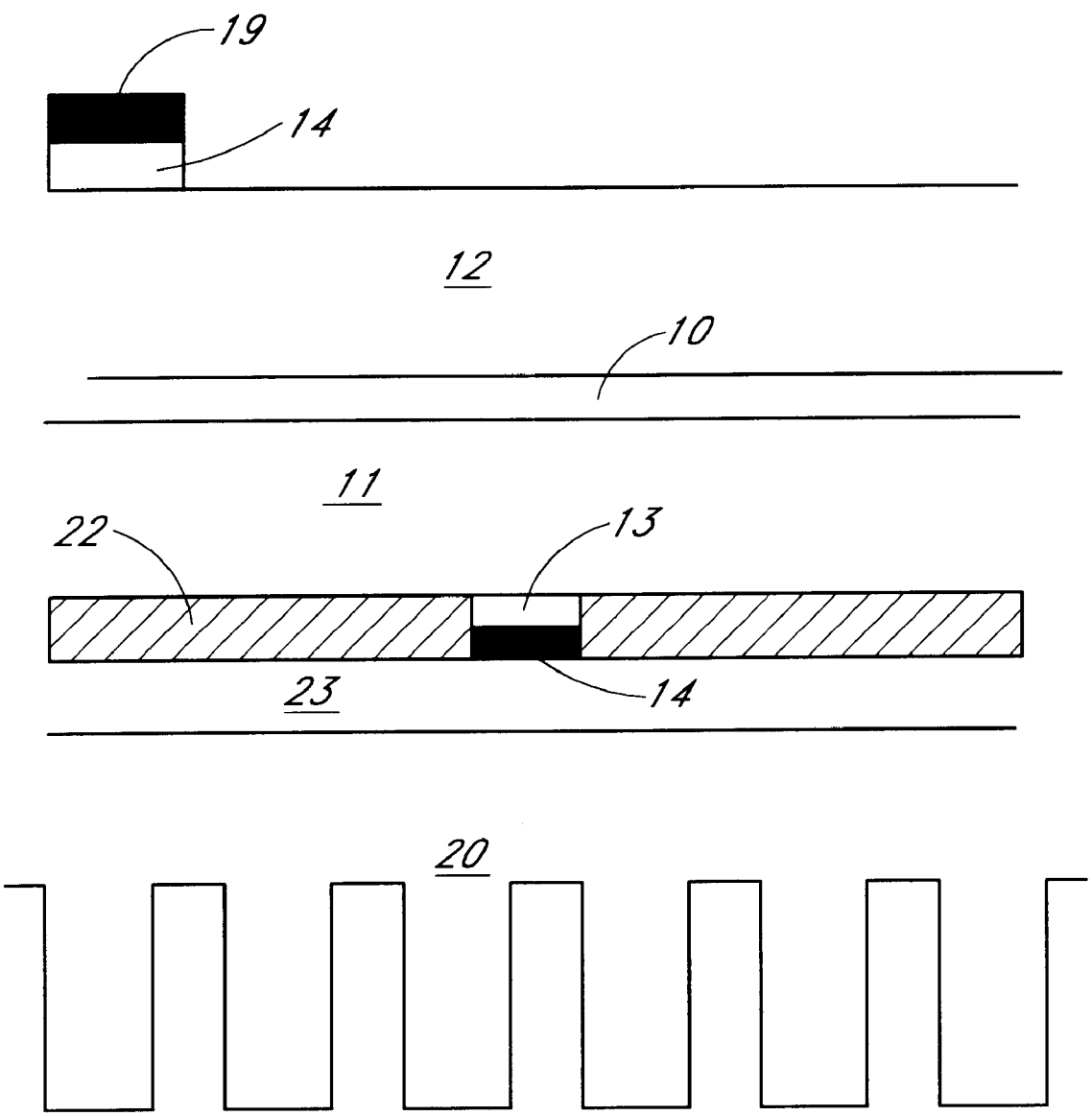
FIG. 1b shows another layer structure of a light-emitting device according to another embodiment of the present invention; a thin-film light emitting device having a metal mirror (23), preferably dielectric-coated (22), with an electrical contact (14) provided through this mirror is shown.

FIG. 1b depicts an alternative structure of a light-emitting diode according to the invention. The carrier substrate is positioned at a reflective edge, a mirror edge of a cavity of a light-emitting diode structure, said cavity including an active layer wherein photons are generated by radiative recombination of charge carriers. The mirror is preferably a dielectric-coated 22 metal 23 mirror, that is not electically conductive. One or several electrical contacts 14 can be foreseen through the mirror for conducting the current through the mirror. The mirror can be bonded to a non-transparent carrier 20. This carrier can be electrically conductive, and serve as electrode contact for the light-emitting diode. It can also be designed to be heat-conducting, even including active cooling, in order to serve as heat-sink for the LED, for instance in high-power applications. The attachment of metal 23 to carrier 20 can be done by a soldering process. Alternatively, waferbonding can also be applied. Contact layers 13 and 14 can be removed from the areas where there are no contacts to the LED, in order to reduce parasitic absorption. Contact 19 can be used for bonding with a conventional wire-bonding process. In the subsequent embodiments represented in FIGS. 2 to 11, the carrier can either be transparent, as in FIG. 1a, or attached to a mirror-side of the LED, as in FIG. 1b.

Figure 2:
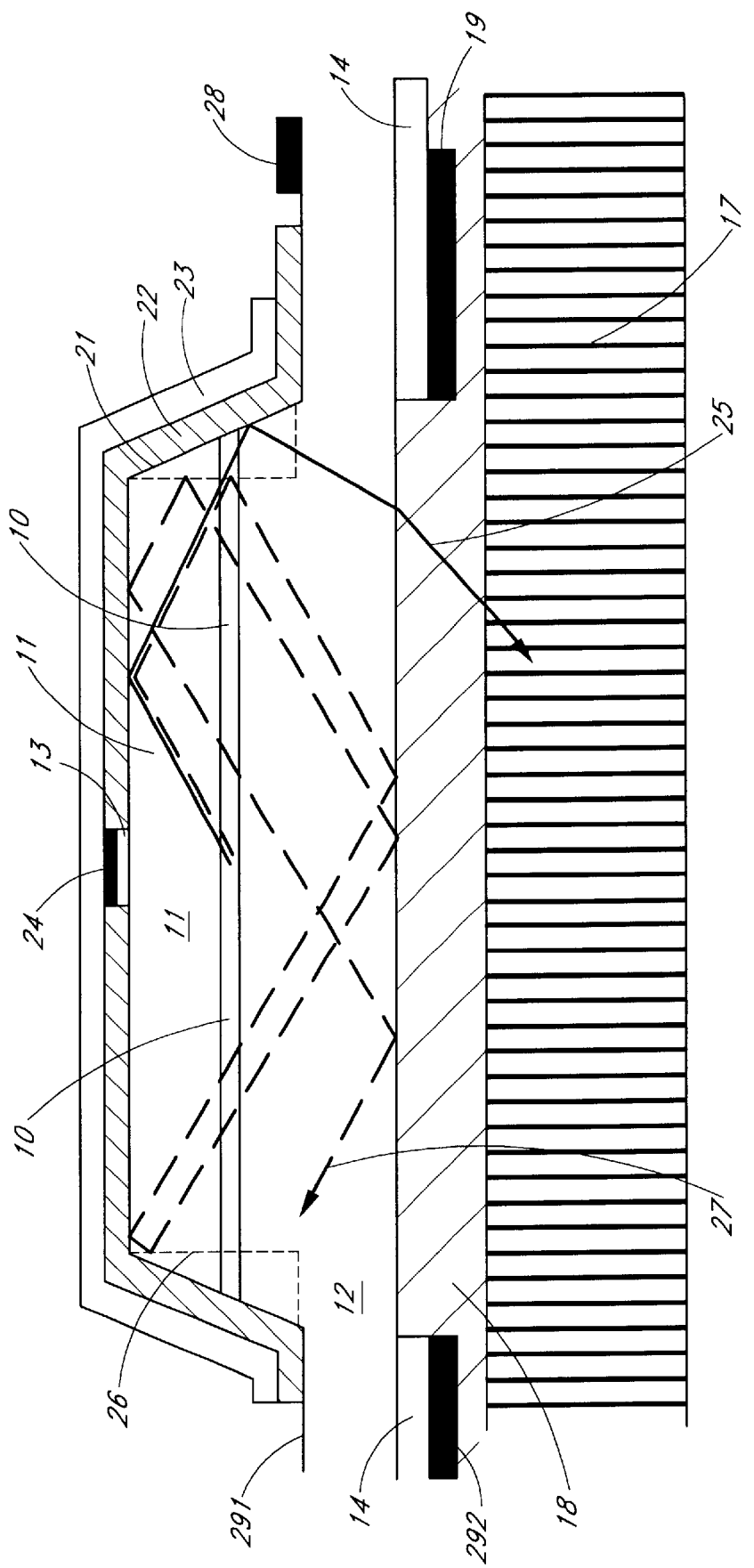
FIG. 2 shows an embodiment of a light-emitting diode according to the present invention.

FIG. 2 depicts an embodiment of a light-emitting diode according to the present invention. The mesa edges 21 shown in FIG. 2 are slanted, and covered by a dielectric layer 22 plus a metal layer 23, except for a contact 24. The contact layer 13 has been removed from most of the top surface, except from the contact region 24, such as to reduce parasitic light absorption by the highly-doped region 13 as much as possible. For the same reason, the contact layer 14 at the bottom of the structure is removed from the light output window under the mesa. Photons generated in the active layer 10 that are emitted with an angle larger than the critical angle $\theta_c$ have an increased probability to be reflected into the angle $\theta_c$ after a number of passes, because of the slanted mesa edges. The photon ray traced 25 for example, escapes after 2 reflections. In contrast, the dotted line 26 represents the walls of a conventional LED with substantially vertical side walls. The same photon would follow trace 27 in this LED, and would not escape. As described above, the current is carried to the LED by means of a metal layer 19. The contact to layer 19 is achieved with the metal contact 28 located at the top side of the device.

In an aspect of the present invention, a radiation emitting device is disclosed wherein said device has a cavity wherein said radiation is generated, and said device can comprise at least two adjacent or abutting edges of said cavity forming in cross-section a substantially triangular shape and the angle between said edges being smaller than 45 degrees and at least one of said edges having a transparent portion. FIG. 3 shows an embodiment of this aspect of the invention. In an embodiment the two edges can be adjacent or abutting one to another and one of the edges is transparent and the other is reflective. The non-transparent edge can be a mesa edge. Also the transparent edge can be a mesa edge. Thus the edges or one of the edges can extend essentially throughout the whole thickness of the device, the thickness of the device bring measured between the mesa edge and the transparent window edge. The edges can have a roughened surface condition. In a preferred embodiment of this aspect of the invention, the mesa edge is tapered with angles $\geq 45$ degrees. In this way, not only photons having one specific direction get out. Also, the photons get out after fewer passes, and less re-combination and re-emission. Therefore, a higher speed performance of the device is achieved.

A preferred embodiment of a LED with slanted mesa edges is a LED with edges having angles of more than 45 degrees with respect to the normal to the main semiconductor surface. Such LED is represented in FIG. 3a. The angle $\theta$ of the mesa edge with respect to normal, is larger than 45° (45 degrees). Therefore, the complementary angle, which is the angle of the mesa edge with respect to one of the surfaces of the LED, is $\phi = \pi/2 - \theta$. FIG. 3b represents the slanted mirror surface 38 and the light window surface 39. One can deduce the trace of a photon 31, emitted in the active region of the LED with an angle $\alpha_1$ with respect to normal. After a first reflection on the mesa edge, this photon is redirected to an angle $\alpha_2 = \alpha_1 - 2\phi$. If this angle is still larger than the critical angle $\theta_c$, then a second reflection on the mesa edge will redirect the photon to an angle $\alpha_3 = \alpha_2 - 2\phi = \alpha_1 - 4\phi$. It is clear that if the angle $\theta$ is chosen to be smaller than the critical angle $\theta_c$, then the photon will always escape from the semiconductor after a number of reflections, irrespective of its emission angle $\alpha_1$. The emission occurs without re-absorption and subsequent re-emission of the photon, and is solely based on the tapering effect of the mesa edge 38.

According to another aspect of the present invention, a device for emitting radiation at a predetermined wavelength is disclosed, said device having a cavity with an active layer wherein said radiation is generated by charge carrier recombination, said cavity comprising at least one edge having a substantially random grating structure. The edges of the device define the region or space for radiation and/or charge carrier confinement. Said edge having a substantially random partially reflective grating structure can extend as at least one edge of a waveguide forming part of said device. The radiation emitting device of the present invention can have a cavity comprising a radiation confinement space that includes confinement features for said charge carriers confining said charge carriers to a subspace being smaller than the radiation confinement space within said cavity. The waveguide forming part of the device can according to such embodiment of the invention be the region of radiation confinement of the device that is larger than the electrical confinement region. The edge of the device extending as a waveguide forming part of said device and having a substantially random partially reflective grating structure can also abut said active layer or extend in said active layer. Thus a way to avoid photons escaping by guided modes from the mesa area is disclosed. One of the edges of the cavity of the device can be a mesa edge. In embodiments of the present invention a transparent conductive layer at the window edge of the devices is not used. This is replaced by a layer of metal at the places where there is no radiation.

According to a preferred embodiment of the invention the region where charge carriers meet for creating radiation (the active layer) has none or substantially none free surface or edge where surface recombination can take place. Thus the radiation emitting device of the present invention can have a cavity comprising a radiation confinement space that includes confinement features for said charge carriers confining said charge carriers to a subspace being smaller than the radiation confinement space within said cavity. The device according to this aspect of the invention can have a cavity comprising at least one mesa edge for defining said radiation confinement space and said device can further comprise a ring of a dielectric material in said cavity. Thus according to this preferred embodiment of the present invention, the devices are optically and electrically confined and the electrical confinement space is a subspace of the optical confinement space. The devices according to this embodiment of the present invention can be confined in form and functioning without additional means or without additional structural features such as extended, large isolation features in the device. The device can operate while strongly reducing the recombination effects of charge carriers in said device. Such confinement in form and functioning can be done e.g. when said devices are being integrated in a single thin film semiconductor. In preferred embodiments of the invention, the confinement in form and functioning is done by a double mesa edge and/or by the presence of a ring of dielectric material in the cavity of the device. The double mesa edge can comprise a first mesa edge above a second mesa edge wherein the active layer of said device is located. The device can also have an active layer that is located above or beneath a ring of a dielectric material in said cavity. Also double mesa's are disclosed that include an isolation plus metal coating on the mesa edges. Such is important for reducing the surface recombination in small radiation emitting devices. A combination of single mesa's with oxidised aperture is also disclosed. The surfaces or edges of the cavity can be textured or roughened. This texturing can be smaller or larger than the wavelength of the radiation and can be substantially random grating structure pattern. The texturing or roughening adds to more scattering of photons inside the cavity, and therefore again improves the efficiency and the speed of the devices.

Figure 4:
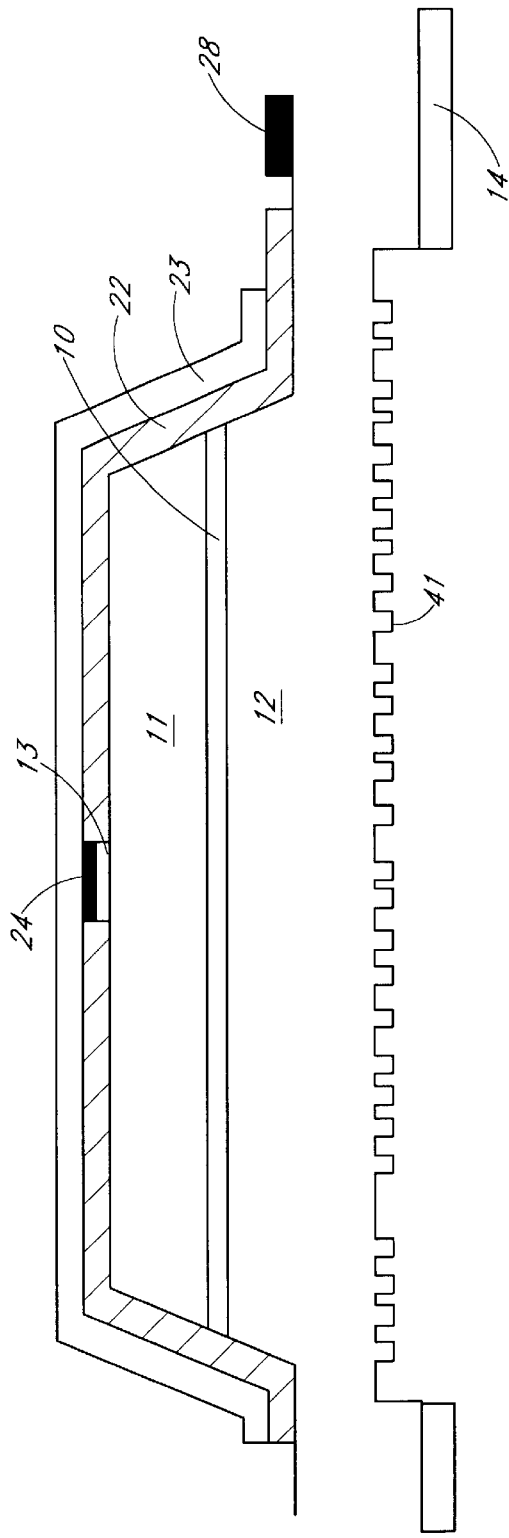
FIG. 4 shows an embodiment of a device according to the invention wherein the device has a cavity with an active layer wherein said radiation is generated by charge carrier recombination, said cavity comprising at least one edge having a substantially random grating structure.
Figure 5:
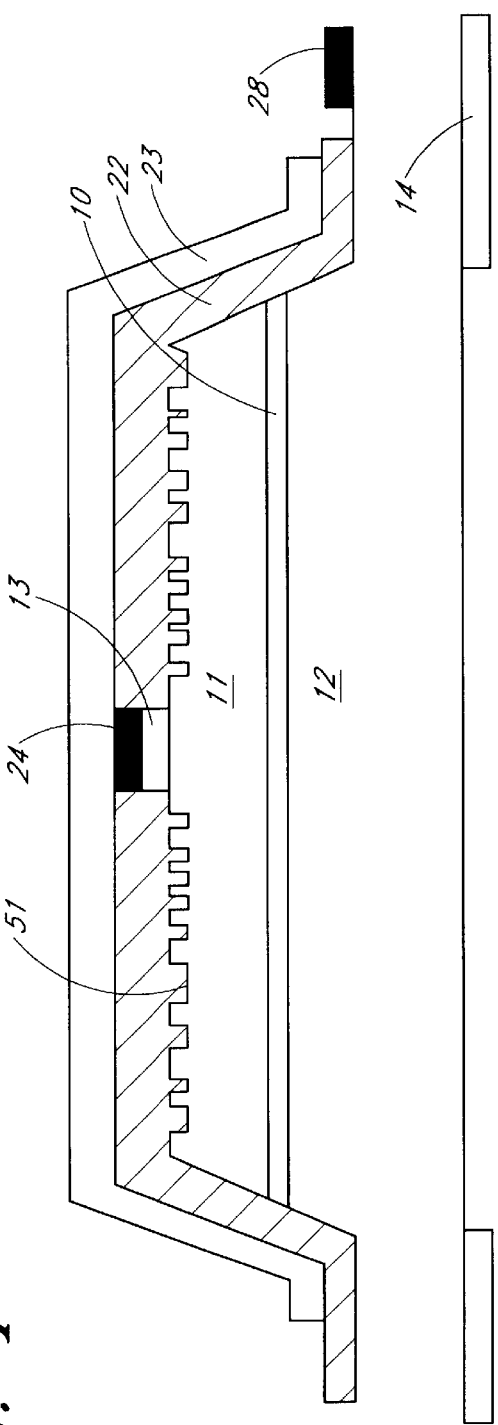
FIG. 5 shows an embodiment of a device according to the invention wherein the device has a cavity with an active layer wherein said radiation is generated by charge carrier recombination, said cavity comprising at least one edge having a substantially random grating structure.

FIG. 4 and FIG. 5 show embodiments of devices according to this aspect of the invention. The devices are made according to the layer structure shown in FIG. 1. In FIG. 4, the light output window, where the contact layer 14 was removed, has a textured or roughened surface 41. Photons that would otherwise undergo total internal reflection at the surface, will now be scattered into a set of output angles. A certain fraction of these photons will be able to escape from the device. In addition, the photons that are scattered back into the device propagate with angles that are different from the incident angle. After reflection at the top surface of the device, these photons arrive again at the light output window. Again, part of them escape through the light output window, and part are reflected into the device, with randomised angles. This process is repeated until the photons are re-absorbed in the semiconductor medium or at the (non-perfect) top mirror. Because of the process of randomisation of the reflection angle and multiple escape chances at the light output window, a substantial fraction of the photons generated inside the diode is allowed to escape from the device. In FIG. 5 is shown a LED where the textured surface 51 is the mirror surface. The conditions for randomisation of the reflection angle and multiple passes at the light output window are also fulfilled in this configuration. It is also possible to combine a textured light-output window and a textured mirror. The textured or roughened surfaces or edges can have a substantially random grating structure.

Yet in another aspect of the present invention, a method for texturing or roughening at least a part of at least one surface of a substrate is disclosed, the method comprises the steps of applying a substantially random distribution of particles on said surface; reducing the size of said particles; and thereafter etching said surface while using said particles as a mask. Thus it means that the etching techniques that are used are not degrading the particles or that the particles are such that the particles are resistant against the etchants used or have undergone a treatment for making the particles resistant against the etchants used.

The surface texturing or roughening of the devices shown in FIGS. 4 and 5 can be achieved by using this method that makes use of a monolayer of closed packed colloidal particles used as mask for etching the semiconductor. In a preferred embodiment of this method of the invention, the diameter of the colloidal particles attached to the semiconductor is reduced by applying an oxygen plasma prior to etching the semiconductor. In this way, the colloidal particles do not adhere to one another, and the surface after etching is more diffusive. The size of the colloidal particles is not strongly critical, but preferentially they have a diameter that is 50% to 200% of the wavelength $\gamma_s$ of the light in the semiconductor ($\gamma_s=\gamma_o/n_s$ with $\gamma_o$ the wavelength in vacuum and $n_s$ the refractive index of the semiconductor). The size reduction in the oxygen plasma is typically 10% to 50% of the original diameter.

In some cases, the colloidal particles do not stand the etchants used to etch the semiconductor. This is for example the case when wet etching is used. For such cases, an alternative texturing or roughening technique according to another embodiment of the invention is described herebelow. First, a thin photoresist layer is applied to the surface of the light emitting device that has to be textured. Then colloidal particles preferentially in a monolayer configuration are applied. Using an oxygen plasma, the diameter of the colloidal particles is reduced, and at the same time the thin photoresist layer is etched using the colloidal particles as mask. Then, the semiconductor surface is etched using the photoresist pattern as mask. Finally, the colloidal particles and the resist are removed, for example by burning in an oxygen plasma. An advantage of this technique is that it allows to use wet etching to create the surface texturing in the surface of the device. Wet etching results in sloped edges for the columnar structures. Sloped angles can result in a larger escape probability for impinging photons, as explained above (FIG. 2).

An alternative way to produce the mask for the surface texturing is to coat the devices with photoresist and develop the texturing pattern in this photoresist by illumination. The illumination can be done through a metal mask of a contact printer or a stepper. This is particularly relevant for red, near-infrared and infrared LEDs, since for these wavelengths the required texturing features are of the order of 200 nm or larger, and such resolution can be achieved directly by UV or deep UV illumination of suitable photoresist. An advantage of this fabrication method is that all LEDs of an array can be made identical, guaranteeing an identical light output.

A further alternative way to produce the mask for the surface texturing using photoresist, is to obtain a random or pseudo-random illumination of the photoresist by direct illumination using an appropriate light source with appropriate wavelength, including deep-UV or UV light, and electron-beam. The direct illumination can be achieved by direct write. It can also be achieved by generation of a specular pattern of a coherent light source such as a laser.

The aspects of the invention shown in FIGS. 1, 2, 3, 4 and 5 enhance the probability that a photon escapes from the thin semiconductor medium, eventually after multiple reflections at the sides of this medium, but before it is re-absorbed. This results in light-emitting diodes with a large quantum efficiency and with large speed. To further increase the speed, and to allow dense packing of light-emitting diodes into arrays, it is also necessary to reduce the lateral size of light-emitting diode. It will further be shown how the present invention can allow for miniaturisation of a high-efficiency light-emitting diode.

Figure 6:
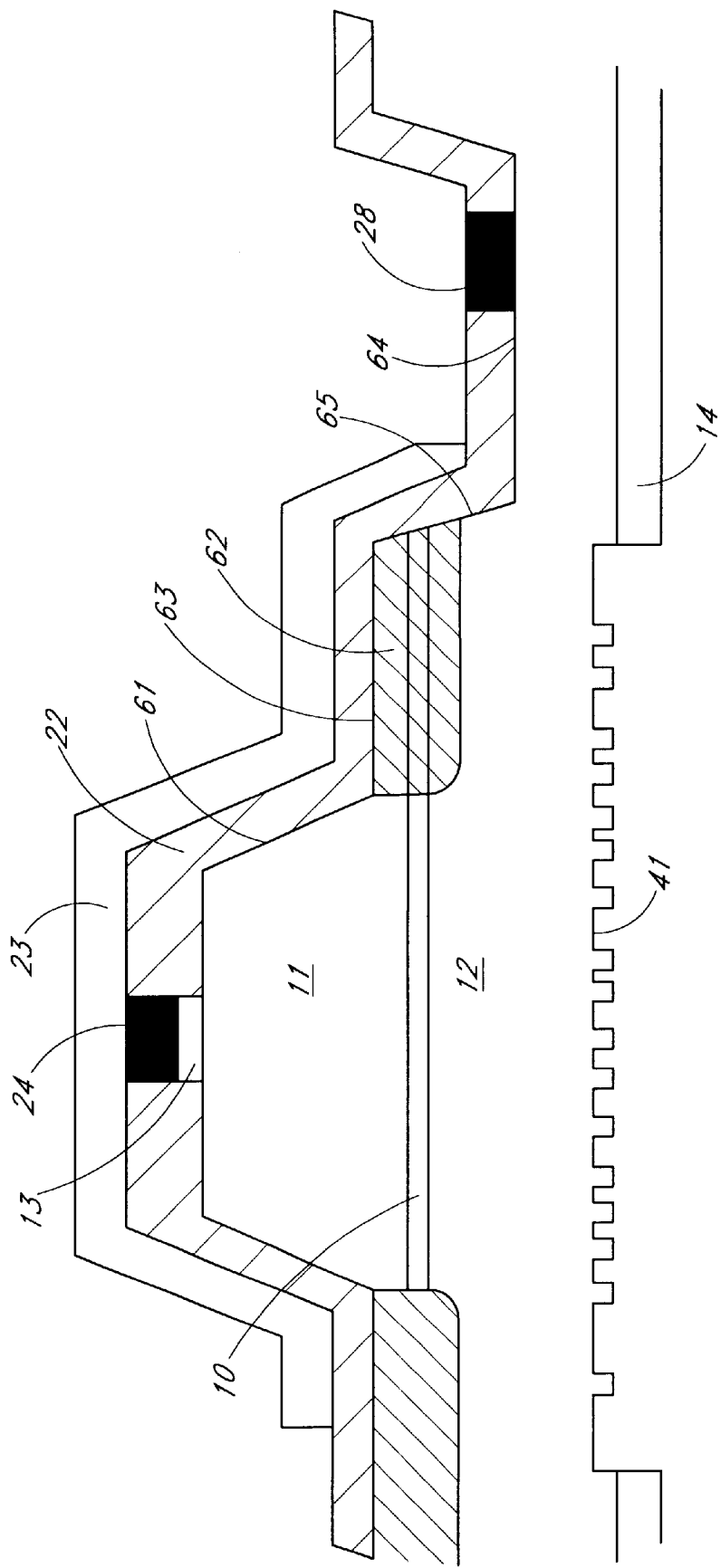
FIGS. 6–11 show embodiments of devices according to the invention wherein the devices have a cavity comprising a radiation confinement region that includes confinement features for said charge carriers confining said charge carriers to a subregion being smaller than the radiation confinement region within said cavity.

To reduce the surface recombination at the perimeter of the mesa, a preferred embodiment of a light-emitting diode according to the present invention is shown in FIG. 6. In addition to the slanted mesa edge from the embodiment of FIG. 2, and to a textured top or bottom surface, this LED includes the use of a double mesa. The first mesa, 61, does not reach the active layer 10 of the structure. It preferably has a depth such that the semiconductor region 62 under its free surface 63 is depleted of charge carriers. The diode region is therefore defined by the first mesa even as this mesa does not penetrate into the active layer of the LED. To make an electrical contact to the bottom doped semiconductor layer, it can be necessary to etch a second mesa 64 through the active layer and into the bottom contact layer. Thanks to the depleted layer 62, the free edge 65 of this second mesa 64 cannot be flooded by the carriers coming from the top electrode 24, and therefore the parasitic surface recombination at this edge is suppressed.

Figure 7:
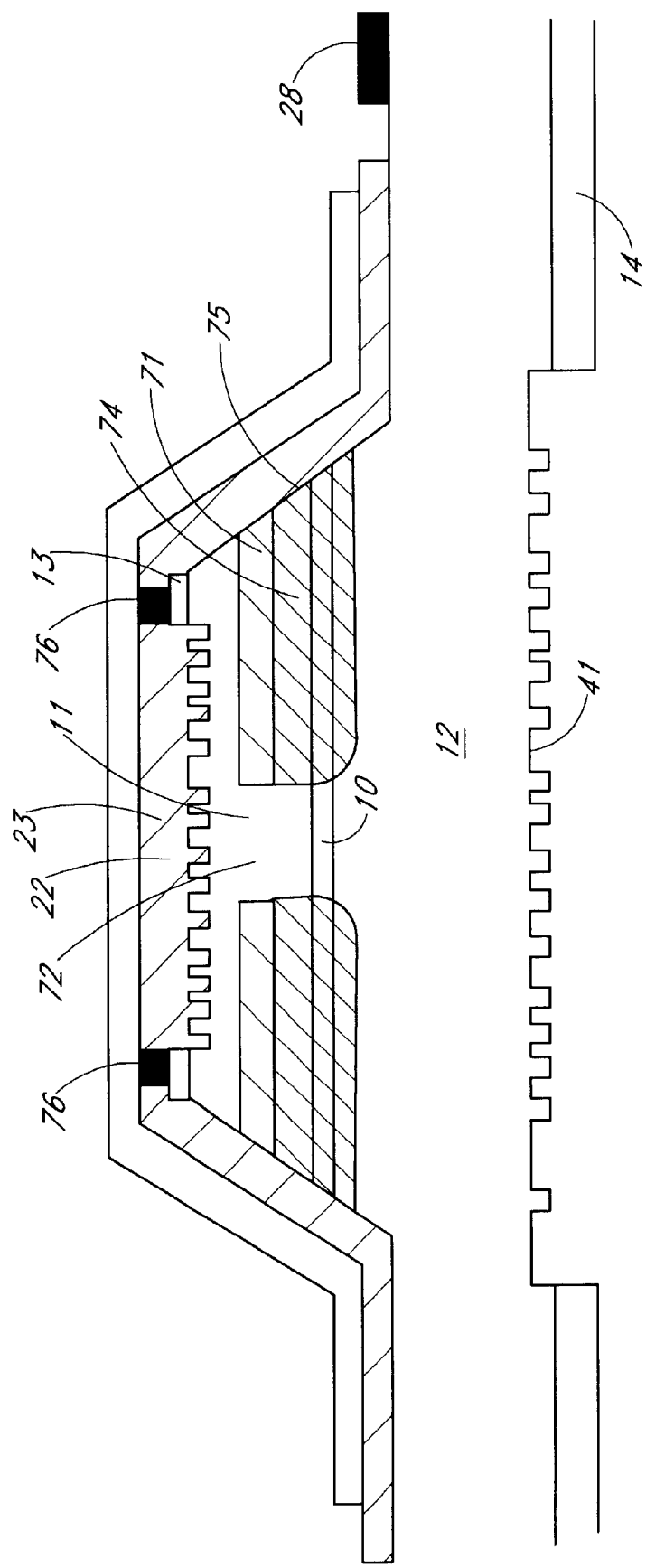

An alternative preferred embodiment is depicted in FIG. 7. In this case, a ring of oxide material 71 confines the current flow to an aperture 72 with a diameter smaller than the diameter of the mesa. The region 74 underneath the oxide is completely depleted of charge carriers, such that carriers injected from the top electrode that are forced to pass through the current aperture 72 cannot reach the surface 75 of the mesa. Again, this has the effect of reducing the parasitic surface recombination current. In addition, the top contact has been implemented as a ring contact 76, located above the oxide ring 71. The reflection of the mirror 23 which is coated with dielectric 22 is better than the reflection at the contact metal 76, because a contact metal is known to cause absorption. In the structure of FIG. 7, most light is generated directly under the dielectric-coated mirror, and therefore the reflection of the top mirror is better than in a structure where light is generated under the top contact. Another way to make electrical contacts to a light-emitting diode without shadowing generated light, is to use a transparent conductive top contact. Such contact can preferably be made using Indium-Tin Oxide. The optical window can partially or totally be covered with such material, that is transparent to emitted light and at the same time can provide a good electrical contact.

Figure 8:
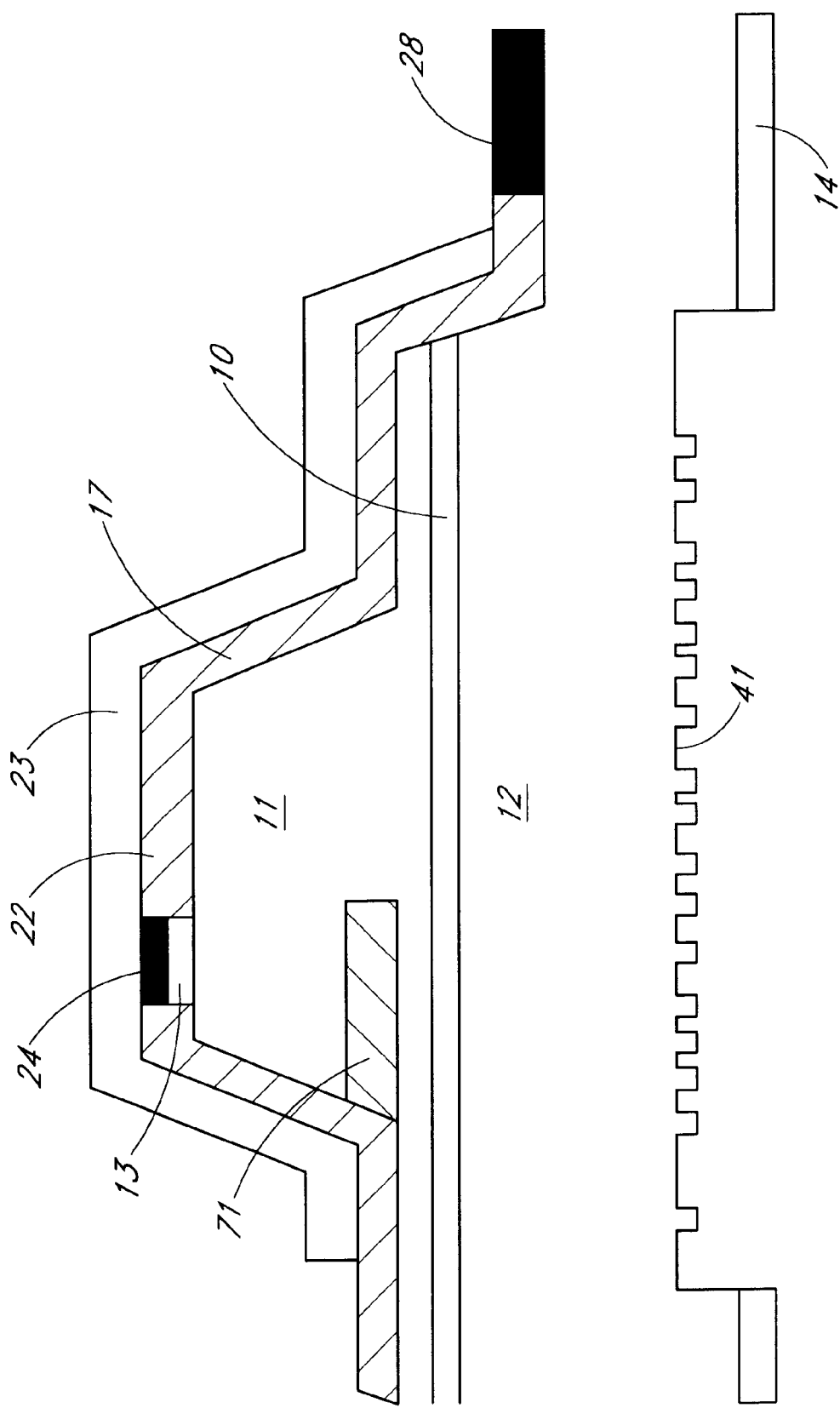

Combinations of the use of a double mesa and an oxide to reduce the surface recombination and to avoid light generation under the metal contact can, of course, also be made. An example is shown in FIG. 8. The LED represented in this figure has an oxide layer that does not form a ring around the complete mesa, but that is restricted to a part of the mesa.

Figure 9:
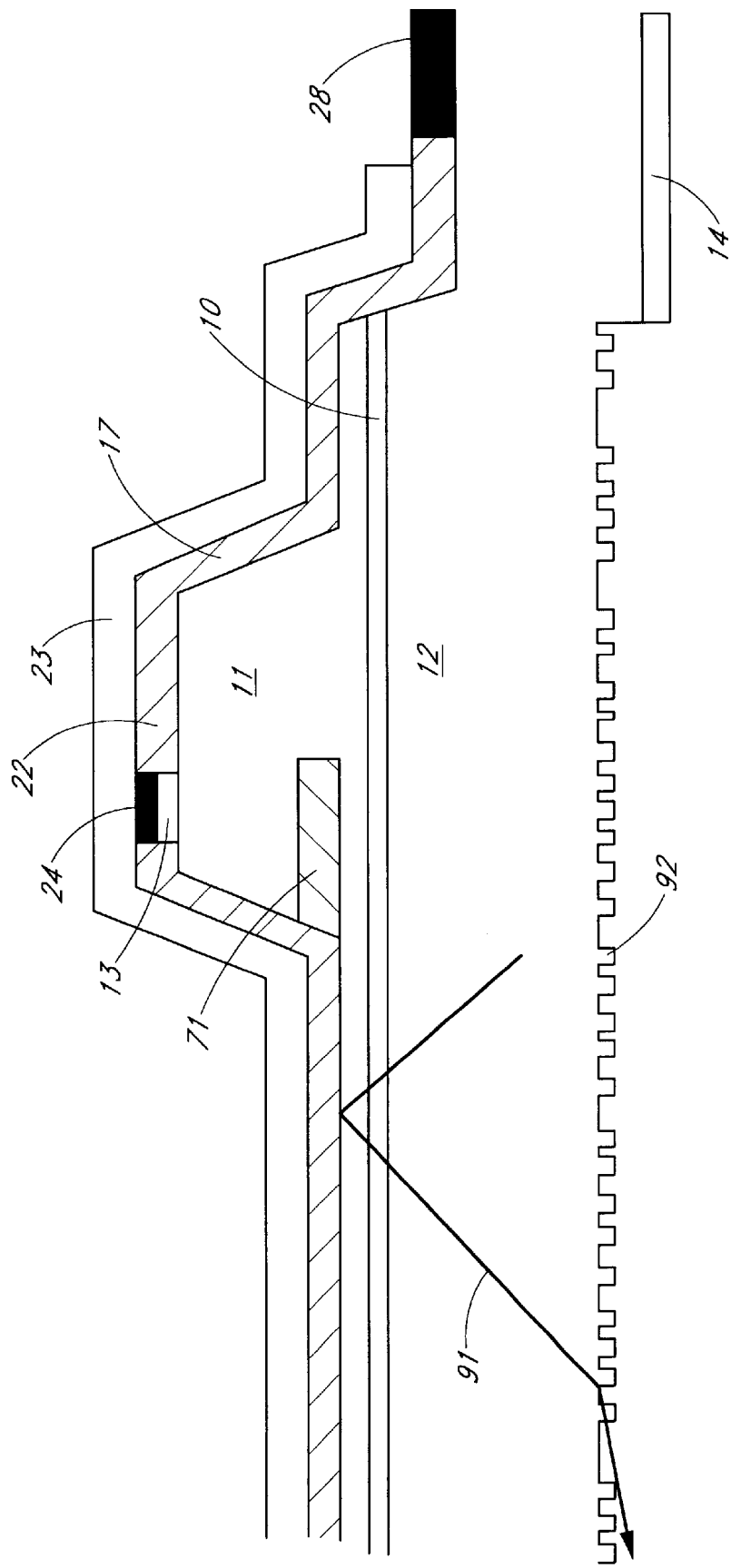

A certain fraction of the light generated in the LED mesa escapes from the mesa region and travels off in the semiconductor substrate by waveguiding. The waveguide is formed between surfaces 291 and 292 of FIG. 2. A more efficient LED is obtained when at least one of these surfaces is textured or roughened, such as to make it diffusive: in that case, part of the waveguided light couples out of the semiconductor at every reflection. An example is shown in FIG. 9: photon 91, that would be guided and finally absorbed in the semiconductor substrate, can escape from the LED by the texturing or roughening 92 because this texturing extends beyond the mesa region. Thus in this way by making in the device an edge having a substantially random grating structure that extends as at least one edge of a waveguide, the waveguide is forming part of the device. The roughened edge of the waveguide can be the top or the down surface of the waveguide. This edge can also abut or extend in said active layer. The waveguide can extend in one dimension or in two dimensions. The optical confinement region finally can thus made to be larger than the mesa region.

Figure 10:
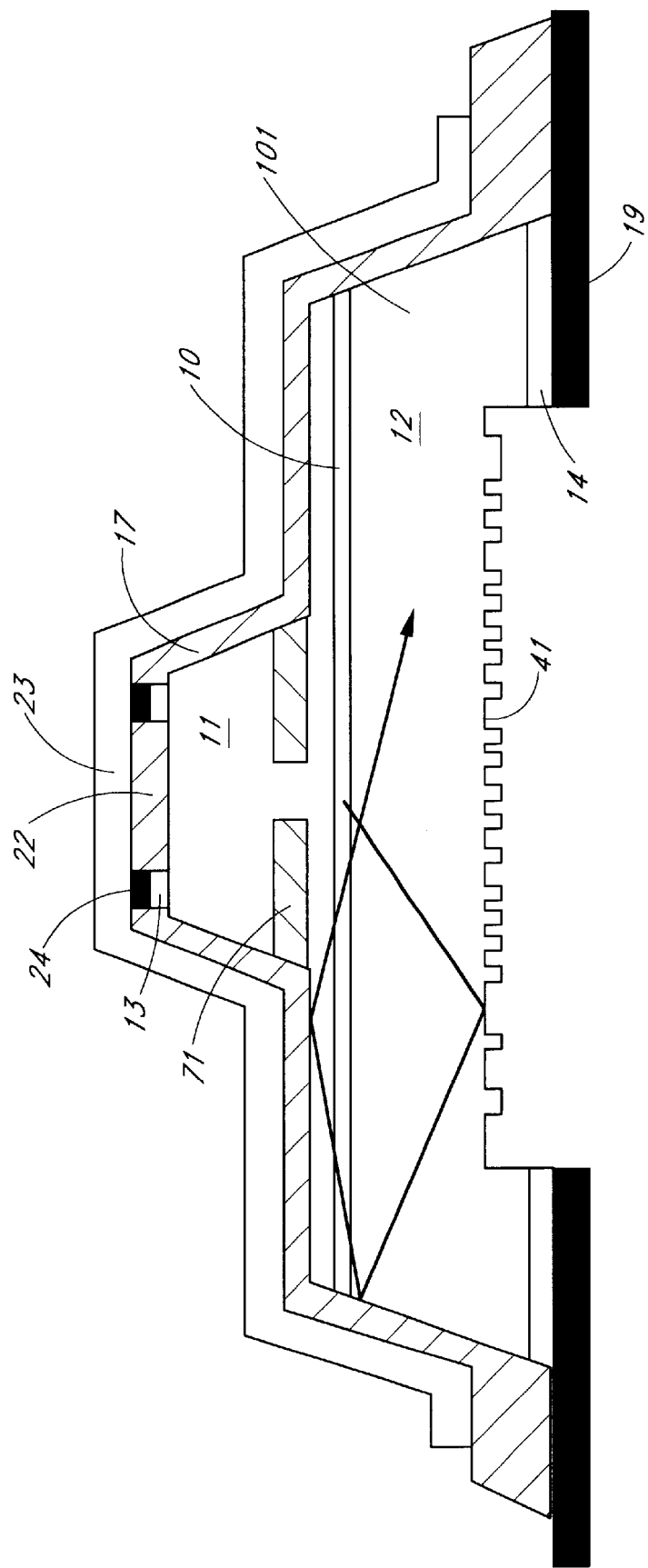

An alternative way to couple out the light that would be lost in the semiconductor waveguide outside the mesa region, is to foresee a mirror that reflects this light to the mesa region or the optical confinement region. In FIG. 10, this is achieved by a double mesa structure. A deep mesa 101 surrounds the first mesa, and is etched through the active layer, and throughout layer 12 to the bottom contact 19. The mesa edge is covered by a dielectric-coated metal mirror, with a high reflectivity. The photons that in the structure of FIG. 9 escape from the mesa region are in the device structure of FIG. 10 reflected back to the mesa or optical confinement region.

Figure 11:
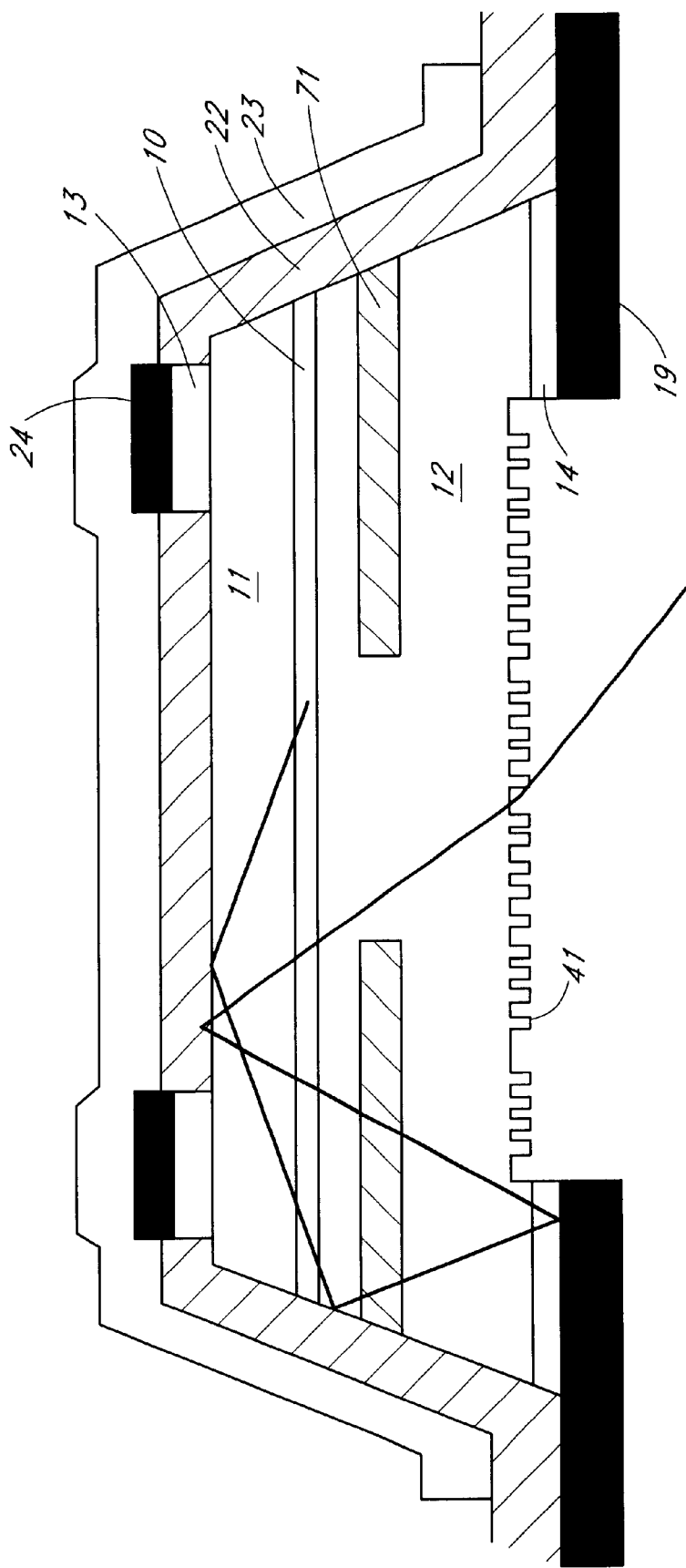

FIG. 11 shows an alternative to the structure of FIG. 10 in which only one mesa is used. The active layer is located at the top side of the oxide confinement ring. Because there is only one mesa, the structure of FIG. 11 can be made smaller than that of FIG. 10. The oxide confinement makes it an electrically small diode, resulting in a fairly large current density achieved at low current level, which translates into a high speed device at low current level. In fact according to the teaching of the embodiments of the invention shown in FIGS. 10 and 11, a device is made that is having an edge with a substantially random grating structure that extends as at least one edge of a waveguide, and the waveguide is forming part of the device. The single mesa and the light output window surrounded by metal layer 19 make the structure of FIG. 11 an optically confined small LED, which is important for high-resolution applications. Also, for high-speed applications it is important to have an optically small source: the spot size of a light beam transmitted through an optical system is of the order of the spot size of the light source, and for high-speed receivers it is required that the spot size at the detector side be small.

A best mode of the embodiment of a device according to the invention is described herebelow.

Figure 12:
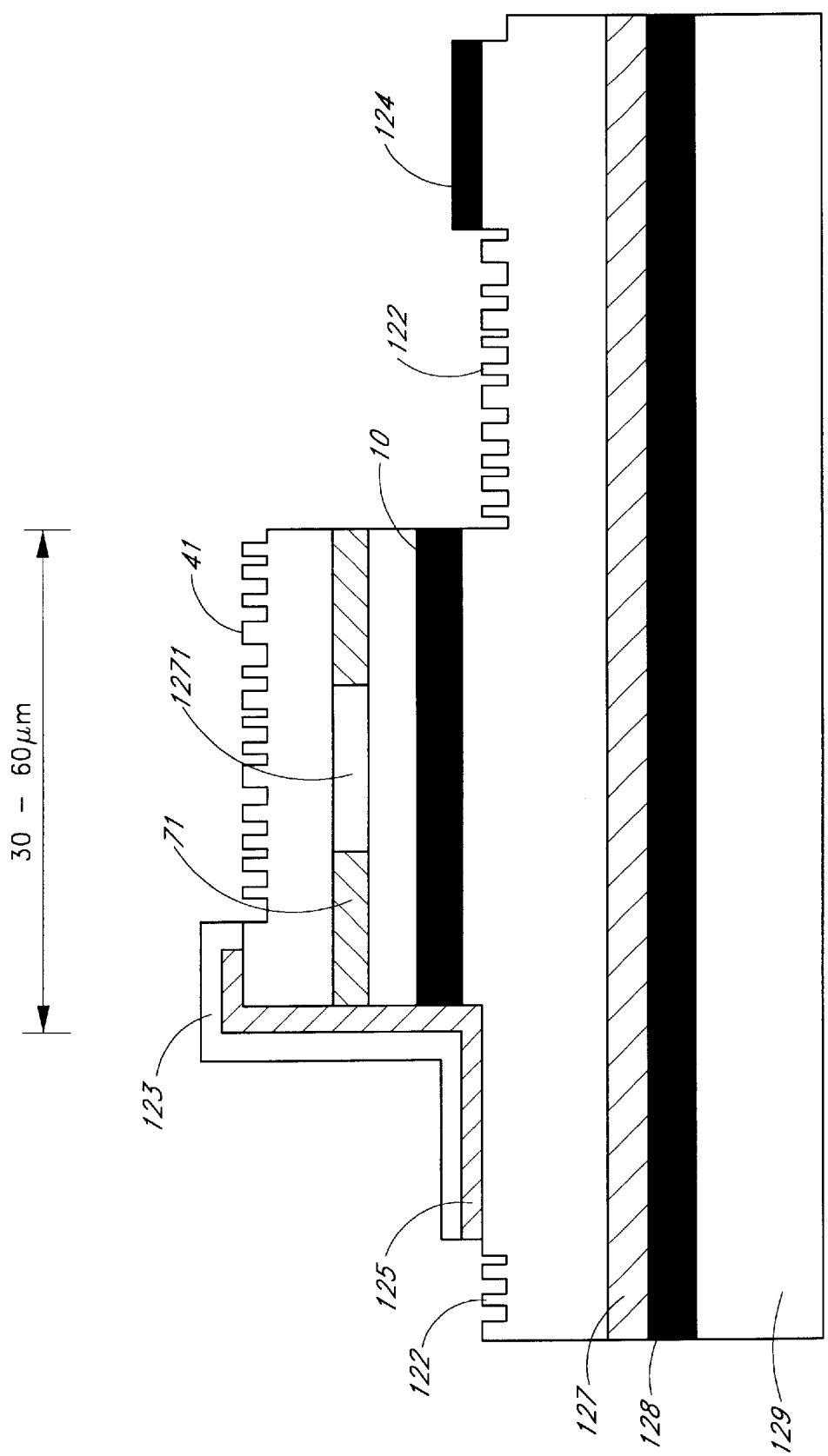
FIG. 12 shows a light emitting device according the best mode embodiment.

In a best mode embodiment of the invention the device structure shown in FIG. 12 and an example process flow given herebelow is disclosed. The device structure shown in FIG. 12 has a waveguide structure extending in two dimensions and having a roughened surface structure 122 with a substantially random grating structure and the roughening features extend in the active layer 10 of the device. The mesa region contains an oxide ring 71. The transparent window 41 of the device is having a roughened surface structure with a substantially random grating structure. The device has a bottom electrode contact (124), a top electrode contact (123) and an isolation layer (125). The device is mounted by VanderWaals bonding on a carrier (129) which has a dielectric coated (127) metal mirror (128). Advantageously, the device structure of the best mode embodiment of the invention, can be combined in an array of devices. In this array of devices the individual devices of said array are being confined in form and functioning as shown in FIG. 12. The individual devices of said array are being defined with a mesa edge and the grooves inbetween the individual devices have a substantially random diffraction grating structure. The array of devices can have a single electrical anode contact and a single electrical cathode contact.

1. Best Mode Structure

The detailed layer design of the best mode device is given herebelow.

Layer Design of the Best Mode Device Grown
with a Riber 3200 Molecular Beam Epitaxy
Apparatus

| Layer No. | Thickness | Material | Doping Concentration ($cm^{-3}$) | Growth Temperature (° C.) |
|---|---|---|---|---|
| 1 | 20 nm | GaAs | p = 1 e 20 | |
| 2 | 20 nm | $Al_{0.2}Ga_{0.8}As$ | p = 3 e 18 | 585 |
| 3 | 200 nm | $Al_{0.2}Ga_{0.8}As$ | p = 5 e 17 | 585 |
| 4 | 1000 nm | $Al_{0.2}Ga_{0.8}As$ | p = 1 e 18 | 585 |
| 5 | 20 nm | $Al_{0.2}Ga_{0.8}As$ | p = 2 e 18 | 585 |
| 6 | 15 nm | $Al_{0.5}Ga_{0.5}As$ | p = 3 e 18 | 585 |
| 7 | 100 nm | $Al_{0.98}Ga_{0.02}As$ | p = 3 e 18 | 585 |
| 8 | 15 nm | $Al_{0.5}Ga_{0.5}As$ | p = 3 e 18 | 585 |
| 9 | 100 nm | $Al_{0.25}Ga_{0.75}As$ | p = 3 e 16 | 620 |
| 10 | 120 nm | GaAs | n = 5 e 17 | 620 |
| 11 | 50 nm | $Al_{0.25}Ga_{0.75}As$ | n = 3 e 18 | 620 |
| 12 | 200 nm | $Al_{0.25}Ga_{0.75}As$ | n = 5 e 17 | 620 |
| 13 | 820 nm | $Al_{0.1}Ga_{0.9}As$ | n = 5 e 17 | 585 |
| 14 | 50 nm | AlAs | n = 3 e 18 | 585 |
| | | GaAs-substrate | n-doped | |

2. Best Mode Processing

A mesa of a diameter between 30 and 60 microns is etched through an $Al_{0.98}Ga_{0.02}As$ layer 71, and through the active GaAs layer 10. The $Al_{0.98}Ga_{0.02}As$ layer is laterally oxidised at 380° C. over 16 to 24 microns. The resulting current confinement aperture 1271 in the mesa has a diameter of 12 to 30 microns. This current confinement localises the generation of the light to an area under the optical window rather than under the top metal contact 123. Since the active layer is made of GaAs, the emission wavelength of the LED is at 865 nm. The bottom contact 124 is an alloyed AuGe/Ni/Au pad, the top contact 123 is a non-alloyed TiW/Au pad. The isolation under the bonding pad is a cured polyimide film 125. Following this, the top side 41 of the device and also the waveguide are textured. A monolayer of polystyrene spheres with a diameter of 400 nm is formed on a water surface, and transferred to the device surface that is treated to be hydrophilic. The coverage of the device surface by beads is then typically 60%. This is brought to about 50% by reducing the diameter of the polystyrene spheres in an oxygen plasma. Chlorine-assisted argon etching is used to etch the wafer using the spheres as a mask. The optimum etch depth was found to be 170 nm. The final step is the transfer of the processed devices by epitaxial lift-off, using a 50-nm sacrificial AlAs layer under the device, on a polyimide-coated 127 gold mirror 128 evaporated on a silicon wafer 129.

The detailed process flow is given herebelow.

1) Main Mesa

Lithographic definition of 30 to 60 μm diameter circles

Etch in $H_2SO_4$:$H_2O_2$:DI (1:8:200) until $Al_{0.98}Ga_{0.02}As$ oxidation layer (layers 6–8 of the layer design) is almost reached (approx. 4 min)

Etch in Citric Acid:$H_2O_2$ (10:1) down to oxidation layer completely (approx. 1 min)

Etch in $H_2SO_4$:$H_2O_2$:DI (1:8:200) for 2 minutes (removal of oxidation layer and active layer)

Strip resist in Aceton

2) Oxidation

Wet thermal oxidation of $Al_{0.98}Ga_{0.02}As$ layer at 375° C. for 10 min in wet nitrogen for 60 micron diameter device mesas and at 365° C. for 30 icron device mesas.

Results in approx. 20 μm lateral oxidation of the $Al_{0.98}Ga_{0.02}As$ layers to a depth of 20 microns or 8 microns respectively.

3) N-contact (124)

Lithographic definition of 60 μm openings in approx. 50 μm distance from the device mesas Self-aligned etch in $H_2SO_4$:$H_2O_2$:DI (1:8:200):

Deposit AuGe/Ni/Au (120/10/60 nm) metal contact.

Lift-Off in Aceton

Anneal contact at 380° C. for 30 sec.

4) Polyimide (125)

Spin adhesion promoter PIQ coupler (Hitachi) @ 5000 UPM for 80 secs

Bake @ 160 for 5 mins

Spin PIQ 13 HV 10 (Hitachi) @ 3000 RPM for 30 secs

Bake to 50° C. with a ramp of 1° C. per minute

Bake at 120° C. in oven for 30 mins

Pattern polyimide by photolithography

Bake slowly to 350° C. (ramp time: 35 mins) in FOG, remain at 350° C. for 10 mins.

5) Top Contact (123)

Lithographic definition of the top p-contact area (overlapping with the device mesa by approx. 10 μm)

2 min 100 W oxygen plasma

Deposit TiW/Au metal contact (40/250 nm).

Lift-Off in Aceton

6) Removal of Top GaAs Layer

Etch top layer in citric acid:$H_2O_2$ (5:1) for 10 secs (selective removal of top GaAs layer).

7) Surface Roughening (See FIG. 13)

Deposition of 430 nm diameter polystyrene spheres onto the device surface:

1 min 100 W oxygen plasma to make the device surface hydrophilic

Prepare a monolayer of spheres on a water surface (see FIG. 13a)

Dip device in pure water (in order to cover it with water), and subsequently

Dip device through the sphere layer on the water surface, then (see FIG. 13a)

Pull device out of the water to transfer the film of spheres onto the device (see FIGS. 13a+b)

Figure 13D:
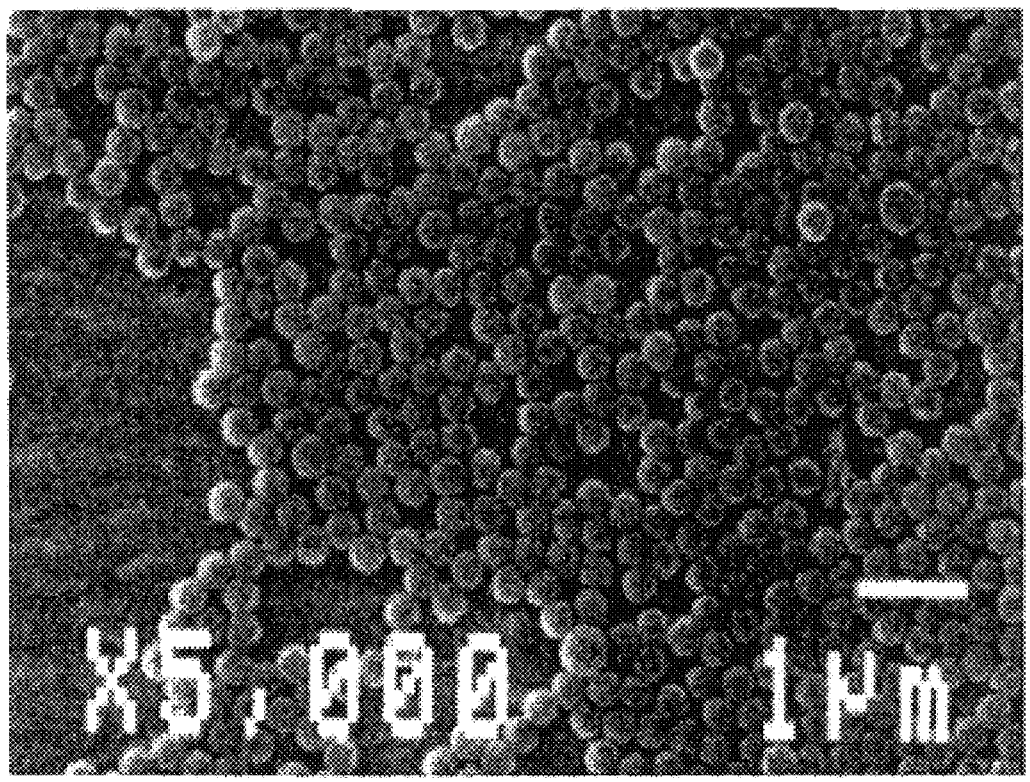

Let the water on the device evaporate (see FIGS. 13b+c; a photograph of the results shown in FIG. 13d)

Figure 14A:
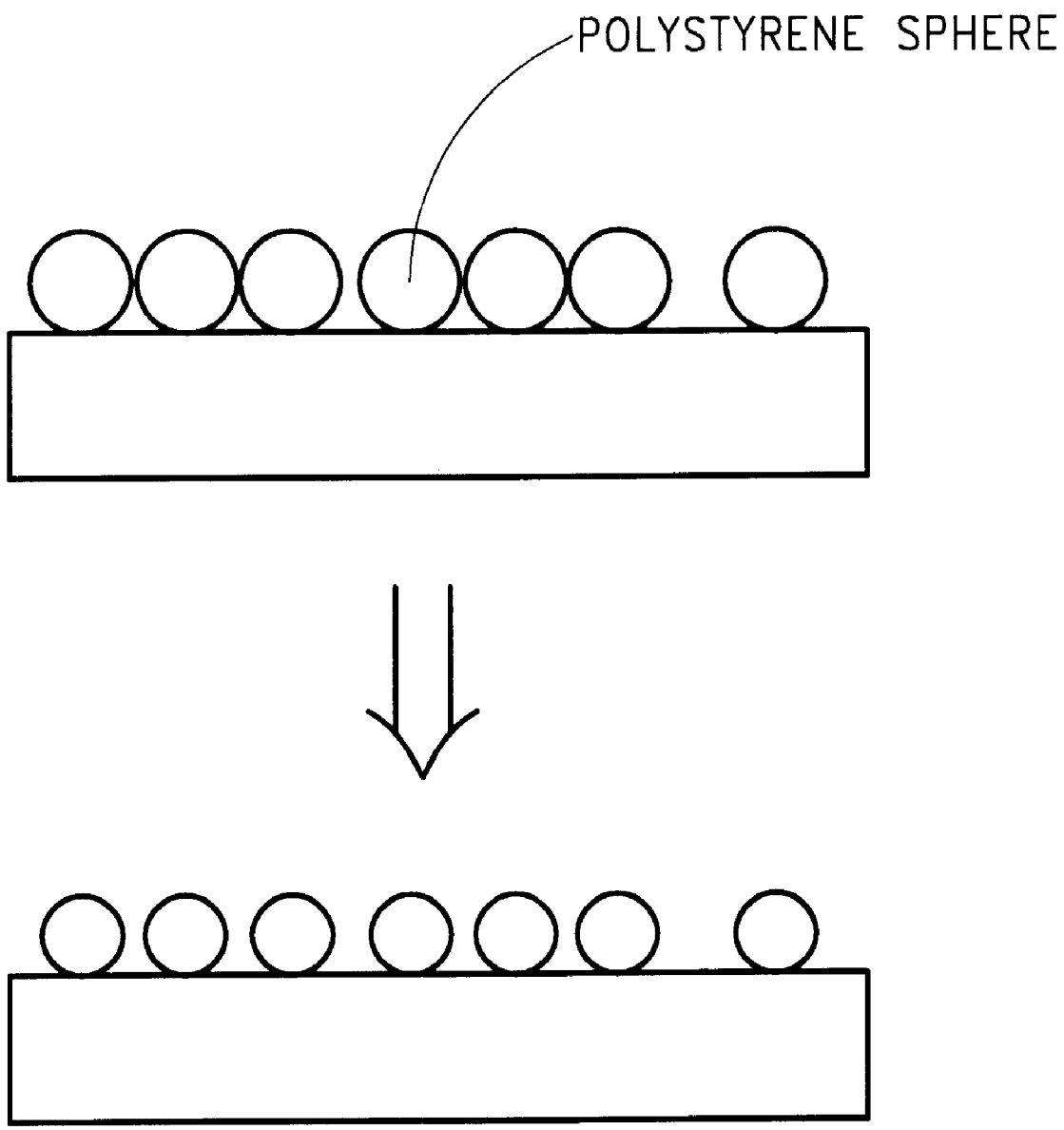
Figure 14B:
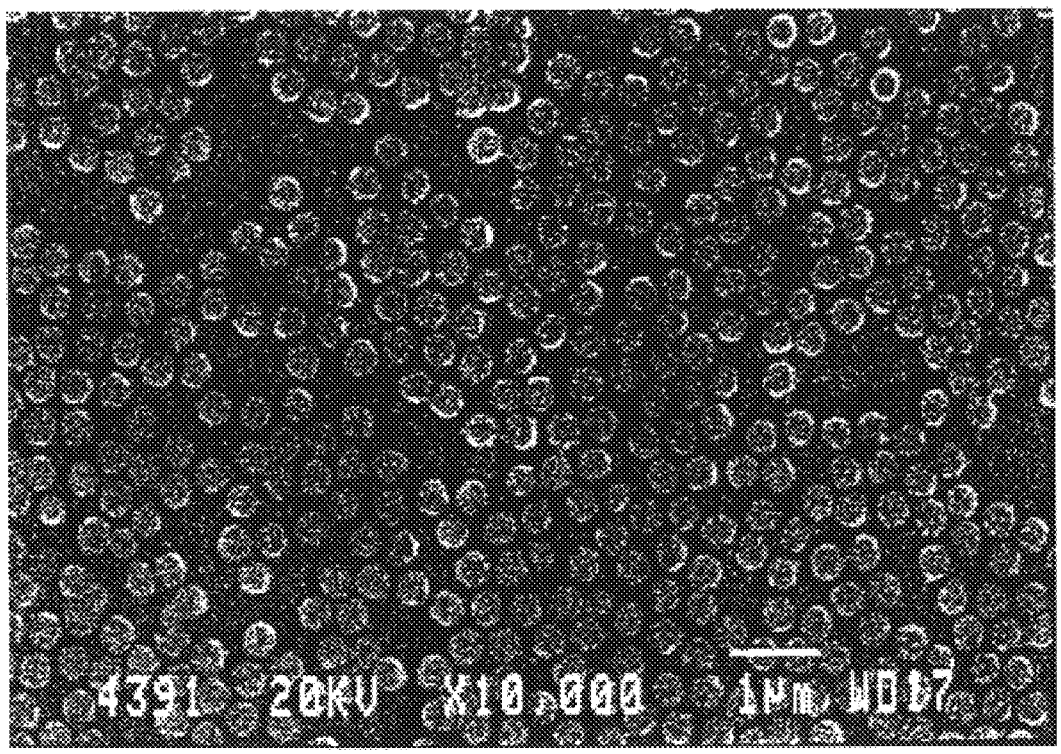

Shrink spheres to approx. 350 nm diameter in oxygen plasma (3 min 100 W) (see FIGS. 14a+b)

Figure 15:
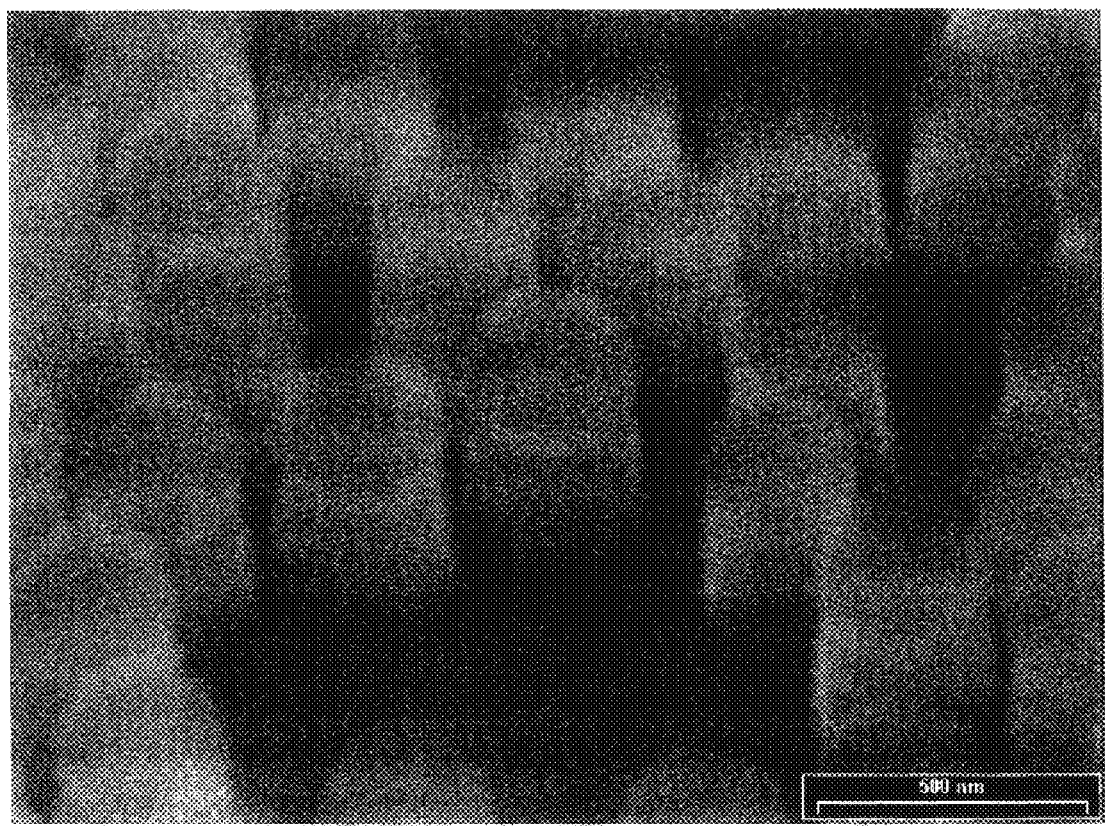

Dry-etching (chlorine assisted Ar milling) to a depth of 170 nm to form cylindrical pillars (see FIG. 15)

Removal of spheres:

with oxygen plasma (15 min 100 W)

or with adhesive tape

Figure 16:
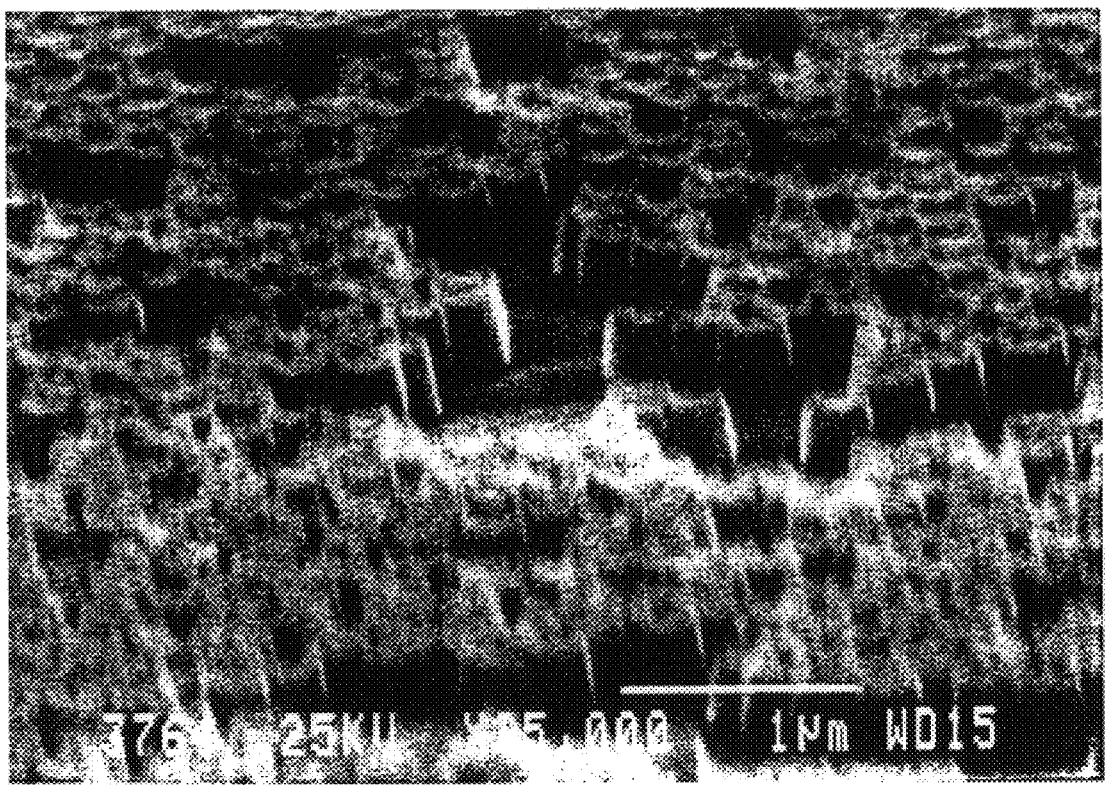

Clean sample in hot acetone with ultrasonic (see FIG. 16). The polystyrene spheres are Nanosphere™ size standard of the company Duke Scientific Corporation. This product is an aqueous suspension of polymer microspheres. The microspheres are made of polystyrene. The oxygen plasma is executed in a plasma system of the company Plasma Technology. The procedure how to use this system is given in the ISO-9000 procedure of IMEC: "Wet etches in the MMIC process" by Stefan Peeters (Doc. ref. 17703 from the 30-10-97, Ver.01.00) on page 6, No. 11. The only difference to this procedure is the RF power and the time (100 W for 3 mins for the LED process).

8) Epitaxial Lift-Off and Van der Waals Bonding

Cleave sample into pieces of approx. 1.5×3 mm.

Cover the top of the sample with Apiezon black wax

Etch the AlAs release layer in 10% HF until the epitaxial layer is completely released from the substrate (takes approx. 4–6 hours)

Transfer the epitaxial layer under water onto a polyimide/Au mirror, which has been prepared as follows:

Evaporate Ti/Au (40/200 nm) on a polished silicon wafer

Spin polyimide PIQ 13 for 60 sec at 10000 rpm

Hard-bake the polyimide as described above

This results in a 170 nm thick polyimide layer on the gold mirror.

1 min 100 W oxygen plasma to make the mirror hydrophilic

Press for at least 2 hours onto the sample with a force of approx. 2 g.

Dissolve the wax in Chloroform.

MEASUREMENTS ON DEVICES ACCORDING TO THE INVENTION

Description of the Measurements and Calibration of the Set-up

The top- and bottom contacts of the devices are probed with needles and a forward bias is applied. The current through the device is measured. The emitted light is detected by a calibrated infrared detector (Newport 818-SL) and measured with a calibrated powermeter set to the central wavelength of the LED (870 nm). During the measurements, the detector is placed approx. 5 cm above the device. The total light output power $P_{tot}$ of the LED is calculated using the formula $$P_{tot} = P_{meas} \cdot \frac{d^2}{r^2},$$

where $P_{meas}$ is the measured power, d is the distance between the device and the detector and r is the radius of the active detector area (r=5.65 mm). The formula assumes a lambertian output of the LEDs, which has been confirmed with a separate measurement. The precise distance between the detector and the device is determined as follows:

The distance between the sample holder and the housing of the detector can be determined with a precision better than 0.1 mm using a calliper. The offset between this measured length and the correct distance can be determined by measuring the output power with various distances between the sample and the detector. For a correct offset the above formula results in an identical result for any height.

The external quantum efficiency is calculated with the formula $$\eta = \frac{P_{tot}/E_{phot}}{I/q}$$

with $E_{phot}$ being the energy of the emitted photons and q the elementary charge.

Quasi-static Characteristics

Figure 17:
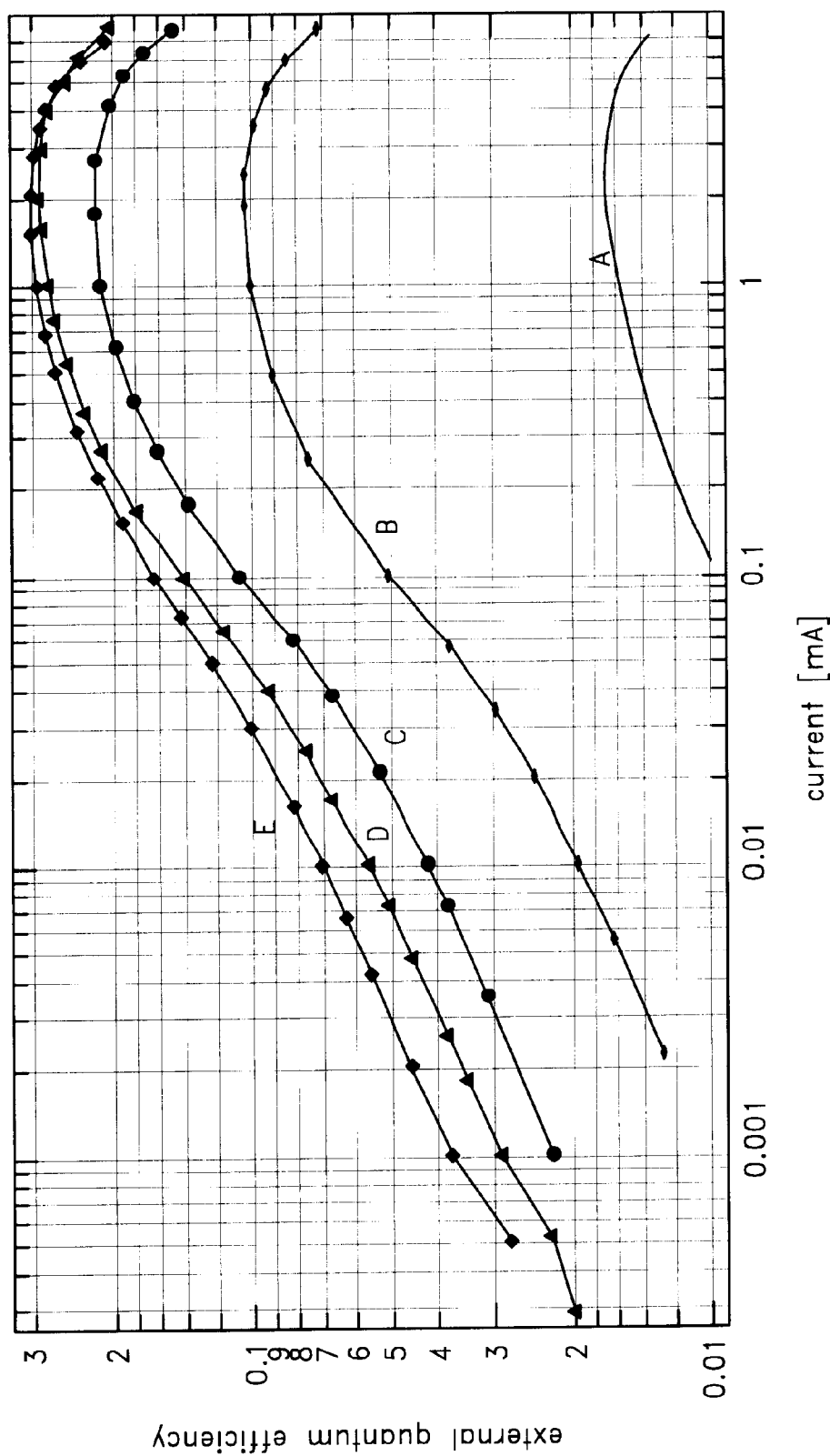
FIGS. 17–24 show measurements on devices according to the invention.

FIG. 17 shows the measured external quantum efficiency, as defined above, versus the current through the LEDs. The LEDs have an active layer of 120 nm thick, and the oxidized aperture has a diameter of 12 microns. A comparison is made between 4 types of devices:

Curve A: LED without steps 9 and 10

Curve B: LED without step 9, but with step 10

Curve C: LED with steps 9 and 10, without variations a and b

Curve D: LED with steps 9 and 10 and variation a, without variation b

Curve E: LED with steps 9 and 10 and variations a and b: very high efficiency is obtained.

Figure 18:
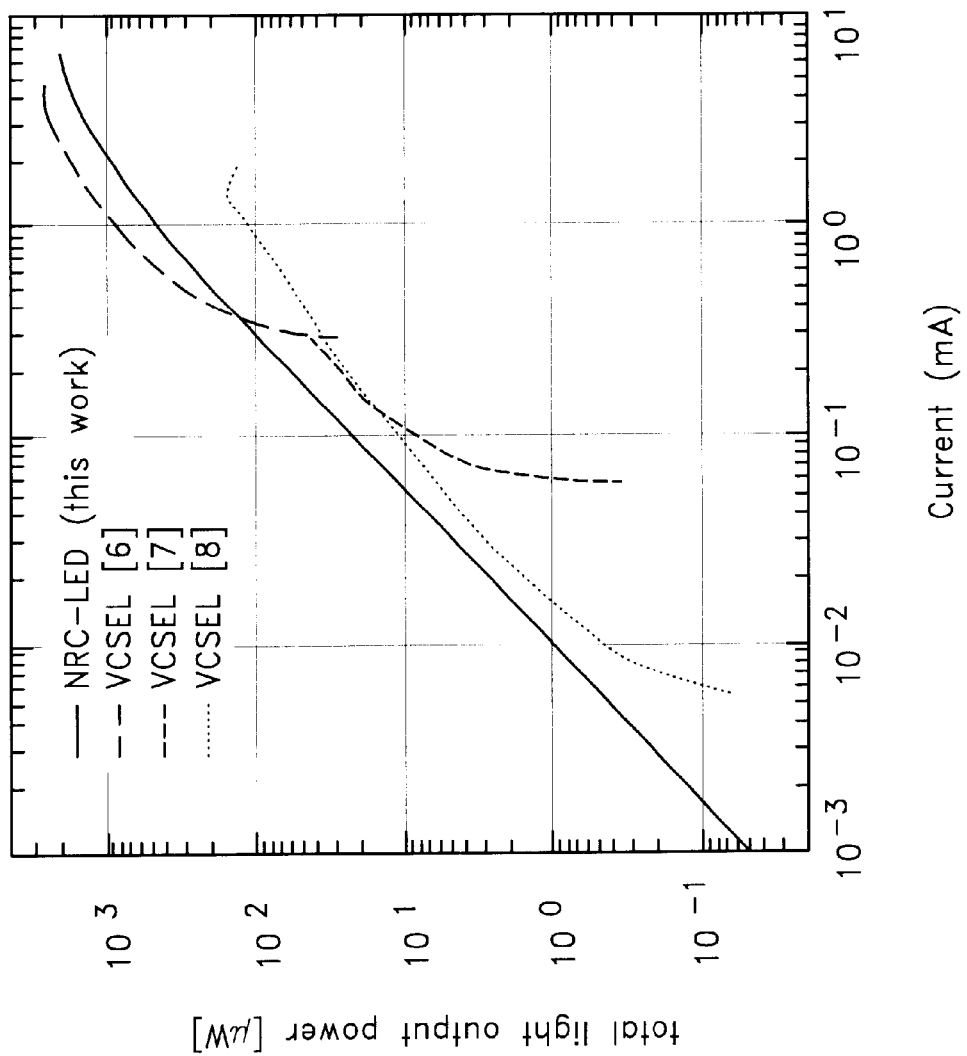

Next, in FIG. 18, the total optical output power of a LED processed according to the invention is compared with the the optical output power of a number of 850-nm and 980-nm VCSELs (see *IEEE Photonics Technology Letters* 8, No. 8, pp. 971–973 (1996): "High-Power Single-Mode Selectively Oxidised Vertical-Cavity Surface-Emitting Lasers" by B. Weigl, M. Grabherr, R. Michalzik, G. Reiner, and K. J. Ebeling; *Applied Physics Letters* 70, no. 14, pp. 1781–1783 (1997): "Low threshold vertical-cavity surface-emitting lasers based on high contrast distributed bragg reflectors" by D. L. Huffaker and D. G. Deppe; and *IEE Electronics Letters* 31. no. 11, pp. 886–888 (1995): "Ultralow threshold current vertical-cavity surface-emitting lasers obtained with selective oxidation" by G. M. Yang, M. H. MacDougal, and P. D. Dapkus) with oxidised apertures ranging from 3 to 9 micron. It can be seen that the output power of the LED of the invention is larger than that of VCSELs for low currents, in particular for currents below the respective VCSEL threshold currents. It can also be seen that VCSELs with extremely low threshold currents have a lower output power than the LED of the invention over the entire current range. This is due to the fact that VCSELs with extremely low threshold currents have highly reflective mirrors, and therefore lower efficiencies. In an optimised short-distance optical interconnect system, the optical power level required from the light source is of the order of 10 to 100 μWatt. The suitability of the LED of the invention for low-power optical interconnects using this range of optical powers is evident from FIG. 18.

Figure 19:
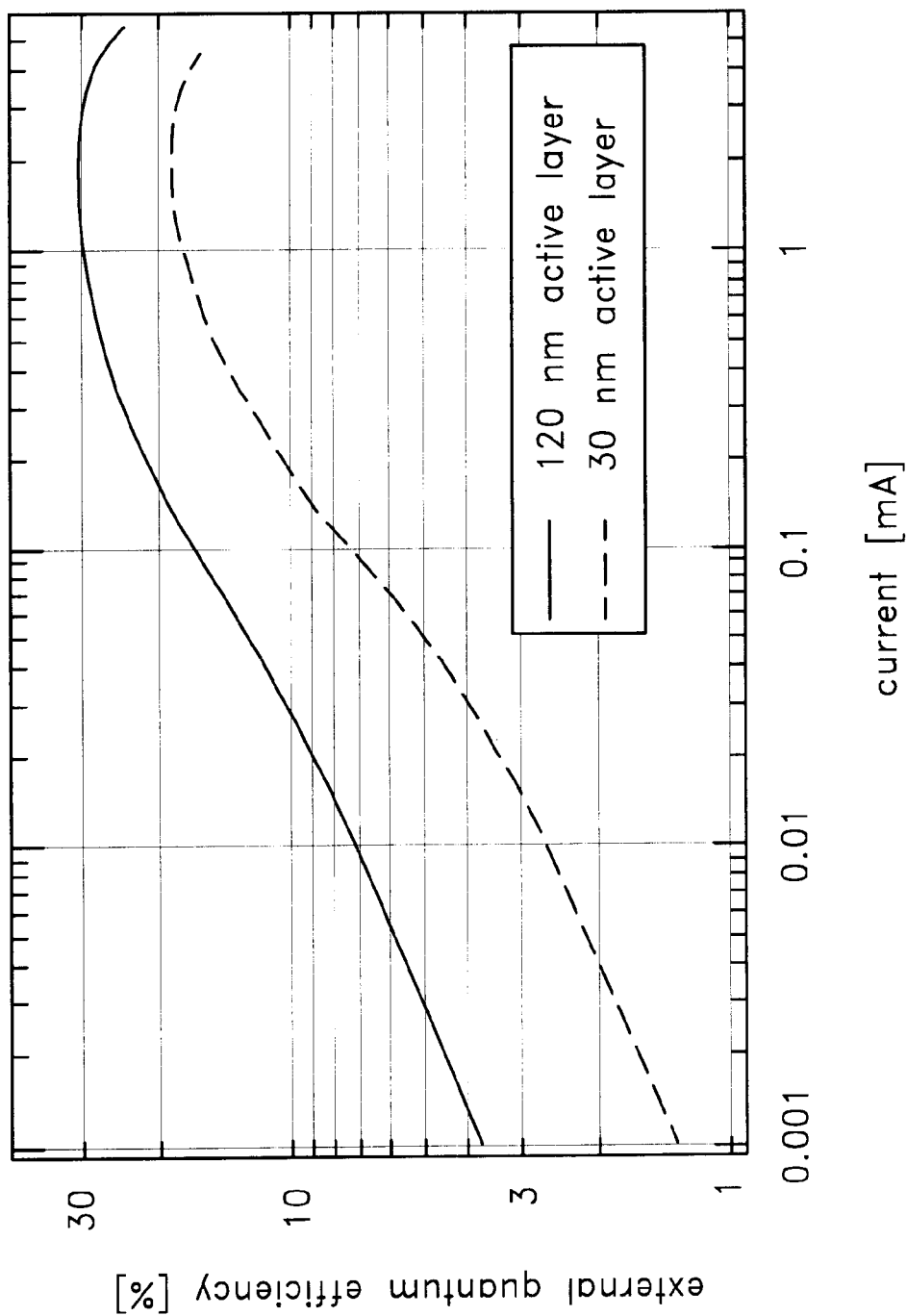

The quantum efficiency of the LED of the invention scales with the active layer thickness. FIG. 19 depicts the external quantum efficiency as a function of current for the LED of FIG. 17, which has an active layer thickness of 120 nm and exhibits a maximum quantum efficiency of 31% at 1.7 to 2 mA compared to that of a LED of the invention with an active layer thickness of 30 nm. For this latter LED, the maximum external quantum efficiency is 18.7%, again for 1.7 to 2 mA of current. The maximum wallplug efficiency of this LED of the invention is 11%. The aperture of the device was 22 μm. The reason for the active-layer thickness dependence of the quantum efficiency is currently believed to be carrier spill-over occurring in thin active layers. This can be eliminated by using a p-type doped active layer and larger bandgap materials in the claddings.

Figure 20:
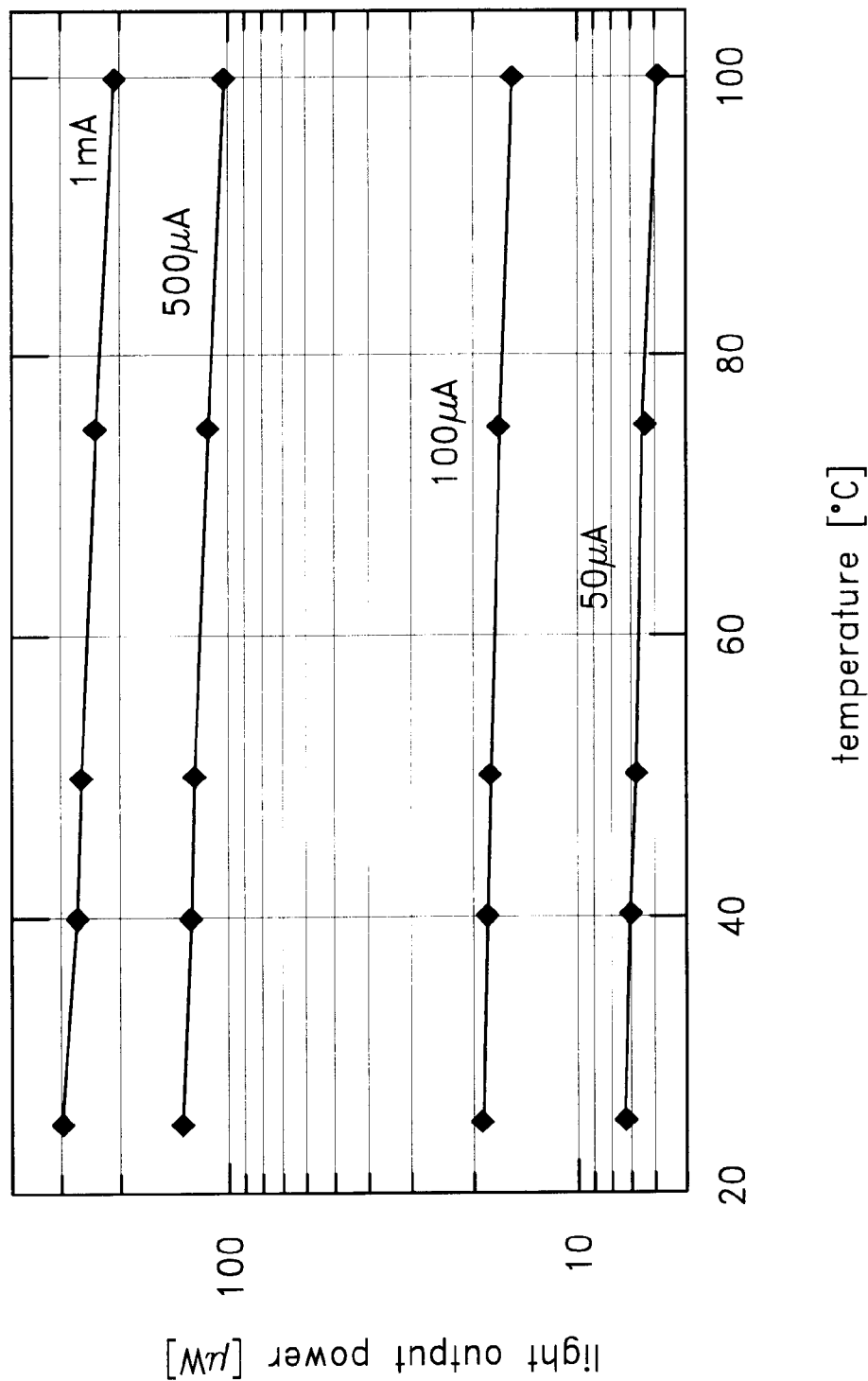

The operation of the LED of the invention does not rely on the match between an emission wavelength and a cavity length. Such device is therefore most suited for applications where it is important to support large temperature fluctuations. CMOS chips have to operate over a large temperature range. In particular processor chips reach temperatures in excess of 100°C. Therefore, the LED of the invention is well suited for optical interconnects on chip. FIG. 20 shows the decrease of the optical output power of the LED of the invention as a function of temperature for various biasing currents. A decrease of 0.36% per degree is observed.

Dynamic characteristics are measured on the devices of the invention. Square voltage pulses are applied to the LED of the invention using 50-Ohm terminated coplanar probes specified for 3 GHz operation. The 10%-to-90% rise and fall times of the voltage pulses is specified to be less than 100 ns. The shape of the optical response of the LED is monitored using a high-frequency diode and a 2-GHz bandwidth oscilloscope.

When applying the voltage pulse, the current rises fast to a level determined by the total series resistance of the circuit. Then, the current drops to its quasi-static level with a time constant $RC_j$, where $C_j$ is the junction capacitance of the LED. This time constant is actually a few hundred picoseconds. At this point, the device is still dark. From then on, the minority carrier concentration builds up in the active layer with substantially the quasi-static current as the current source. This build-up results in light generation, and therefore the light output can be used as a direct measure of the minority carrier charge content in the active layer. The larger the quasi-static current through the device, the faster the rise time of the light output.

Figure 21:
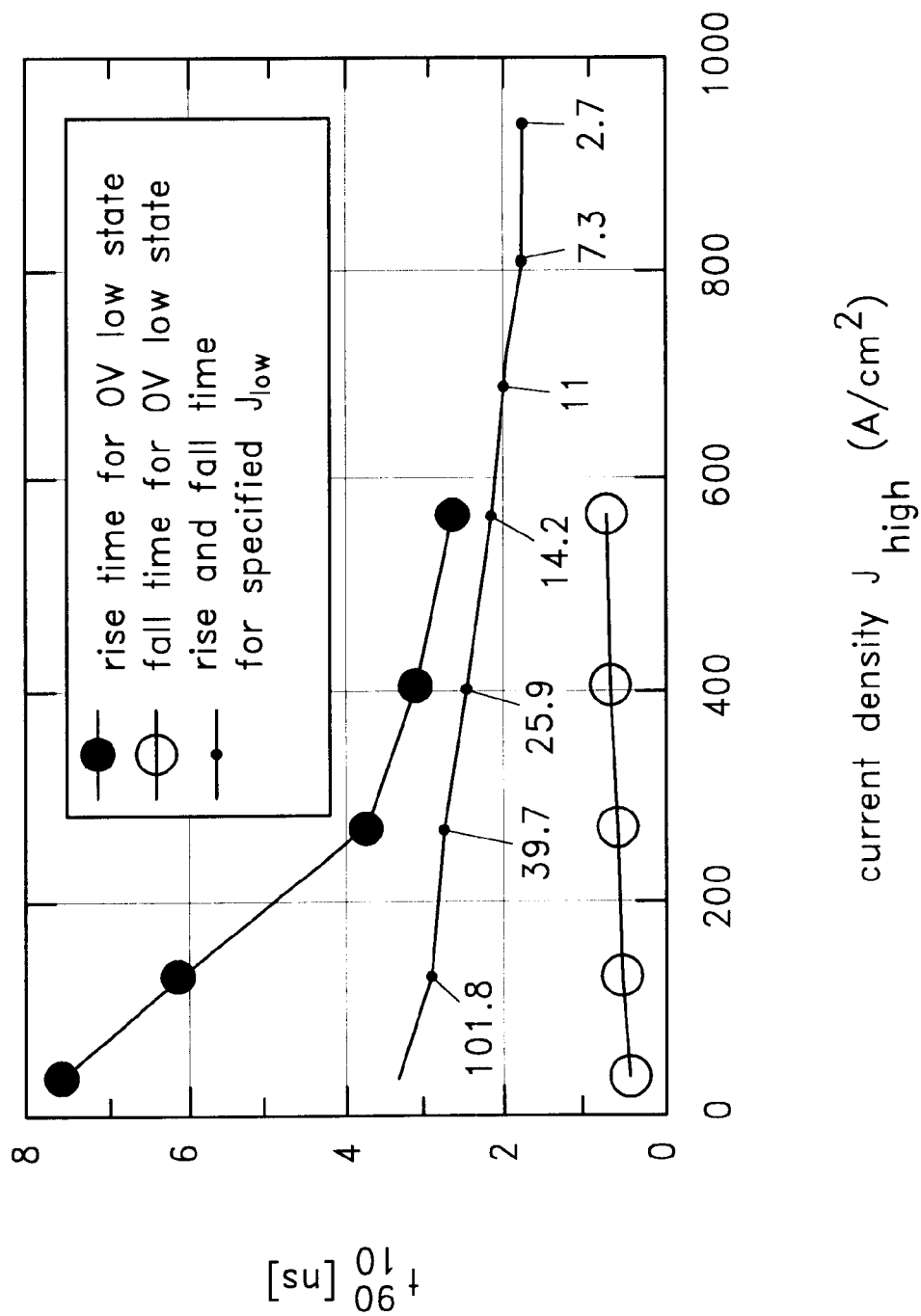

From the above, a thinner active layer obviously leads to a faster device at a given current density. Also, a larger driving voltage, corresponding to a larger quasi-static current, results in a shorter optical rise time. The closed circles in FIG. 21 are the measured 10%-to-90% rise times when the 30-nm active layer of the LED of the invention with a current aperture of 22 μm is switched between 0 V and various voltages. The horizontal axis is the quasi-static current density through the current aperture corresponding to the different voltages. The 10%-to-90% fall time of the optical signal when the voltage is swung back to 0 V is shown as the open circles in FIG. 21. It is smaller than the rise time. This is due to the fact that the minority carriers are extracted from the active layer by an inverse current flowing through the LED rather than by recombination (see *IEEE Journal of Lightwave Technology*, Vol. 14, p. 1721–1729 (1996): "Temperature and modulation characteristics of resonant-cavity light-emitting diodes" by E. F. Schubert, N. E. J. Hunt, R. J. Malik, M. Micovic and D. L. Miller).

When measuring an eye diagram of an LED, the above-explained asymmetry between rise and fall times appears as a distorted eye. However, at the receiver end of an optical interconnect line it is desirable to have a more or less symmetric eye, in other words roughly equal rise and fall times. This can be achieved by switching the LED between a non-zero "low state" and a larger "high state". Indeed, a non-zero low state means that there is a certain offset carrier density in the diode in the low state. Due to this offset carrier density, the rise time of the diode is smaller than when starting from zero. On the other hand, when switching the diode from the high state to a non-zero low state, the extraction current is smaller than when the diode is switched to zero. Therefore, the fall time increases when one switches to a non-zero off state (see *IEEE Journal of Lightwave Technology*, Vol. 14, p. 1721–1729 (1996): "Temperature and modulation characteristics of resonant-cavity light-emitting diodes" by E. F. Schubert, N. E. J. Hunt, R. J. Malik, M. Micovic and D. L. Miller). As a result, for every high-state voltage (quasi-static current density), it is possible to find a low-state voltage (quasi-static current density) such that the optical rise and fall times observed when switching between the states are equal. The resulting rise and fall times are plotted in FIG. 21 as a solid line, again as a function of the quasi-static current densities corresponding to the high-state voltage. As described above, the rise times for this switching mode are considerably shorter than the rise times when switching from 0 V, but the fall times are somewhat larger than when switching to 0 V. The low-state current densities $J_{low}$ used to achieve equal rise and fall times are indicated on the figure.

From FIG. 19 it can be read that external quantum efficiencies of over 18% are reached for currents between 1.3 mA and 3.2 mA. This corresponds to current densities between 390 mA/cm$^2$ and 840 A/cm$^2$. From FIG. 21, the rise and fall times corresponding to 390 mA/cm$^2$ are 2.2 ns, and the rise and fall times achieved at 840 mA/cm$^2$ are 1.9 ns. Thus in the current range corresponding to the maximum external quantum efficiency, the diode rise and fall times are about 2 ns.

Figure 22:
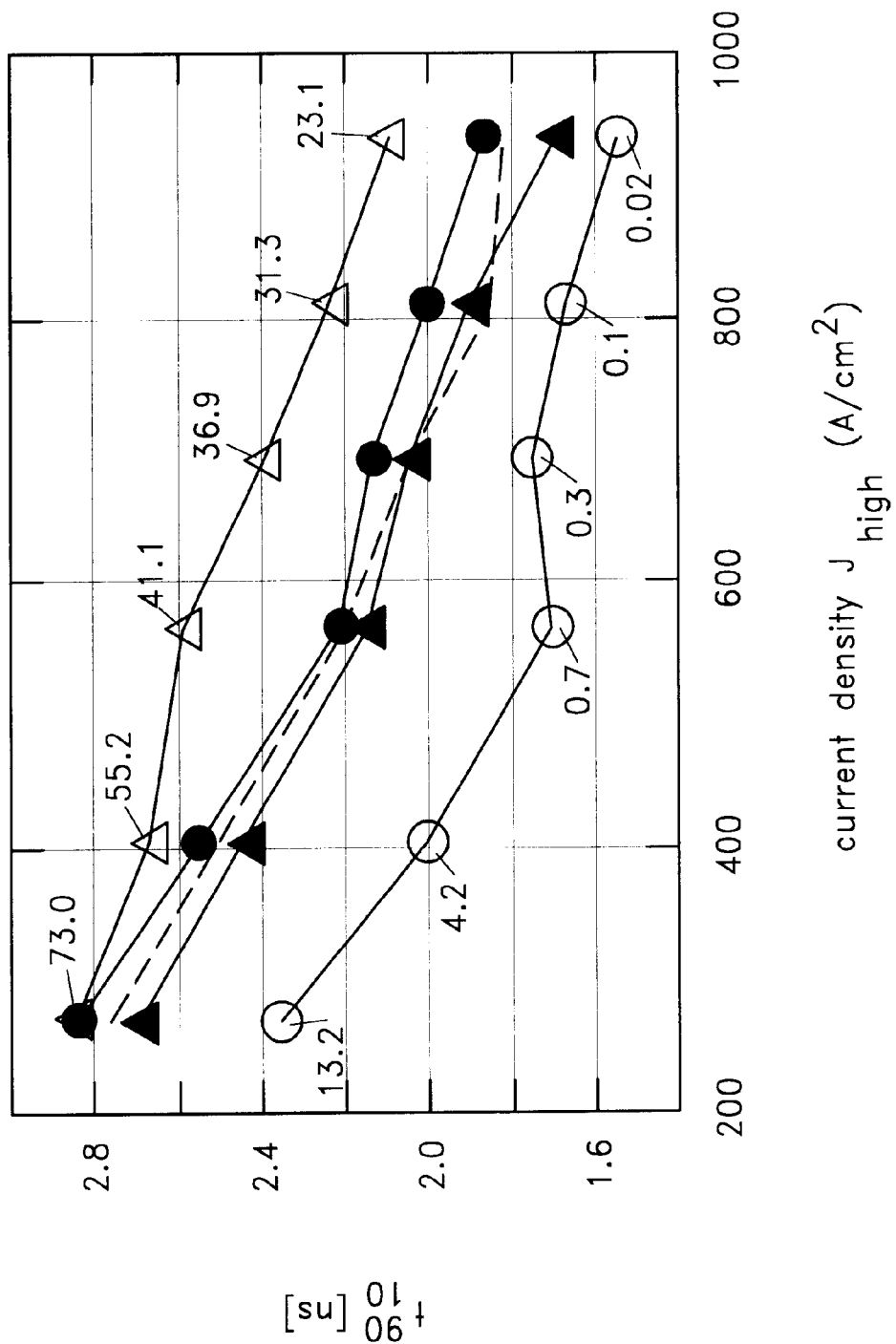

When considering the fabrication of large arrays with high yield, it is beneficial that the high-state and low-state currents do not have to be set with high precision. The sensitivity of the rise and fall times to a variation in the high-state current density is given in FIG. 21. The influence of variations in the low-state current density is given in FIG. 22. The dashed line is the 10%-to-90% rise and fall times for the lower current density chosen to make these times equal, i.e., the solid-line curve of FIG. 21. The closed and open circles in FIG. 22 are the rise times and fall times, respectively, observed when the lower current density is decreased to the values indicated next to the open circles. The closed triangles and the open triangles are the rise and fall times, respectively, measured when the lower current density is increased to the levels indicated next to the open triangles. It can be concluded that when reducing the low-state current density by at least a factor 3 as compared to the low-state current density that results in equal rise and fall times, the rise time changes only marginally, while the fall time decreases. Hence, the setting of the low-state current density is not critical.

Figure 23:
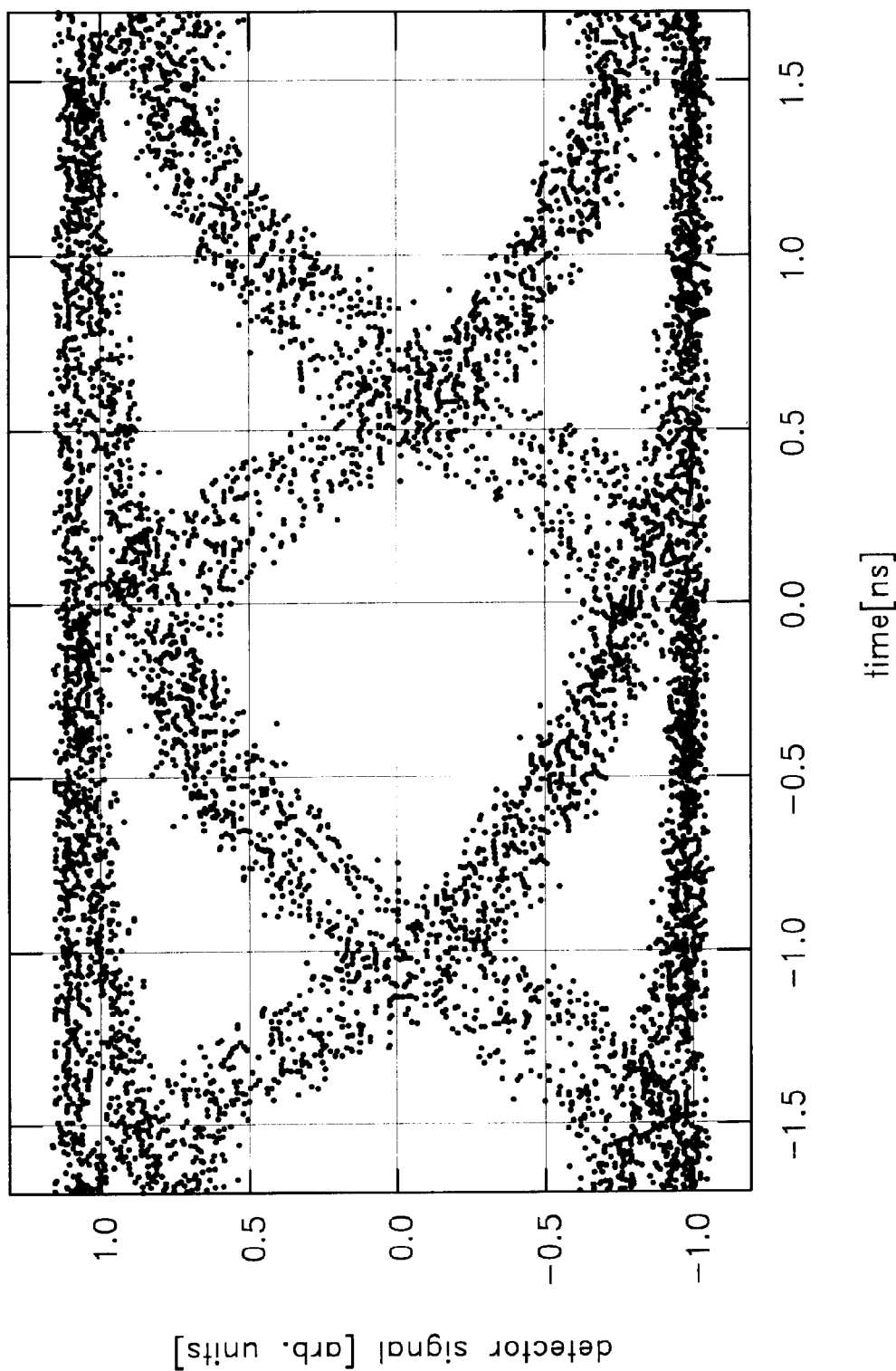
Figure 24:
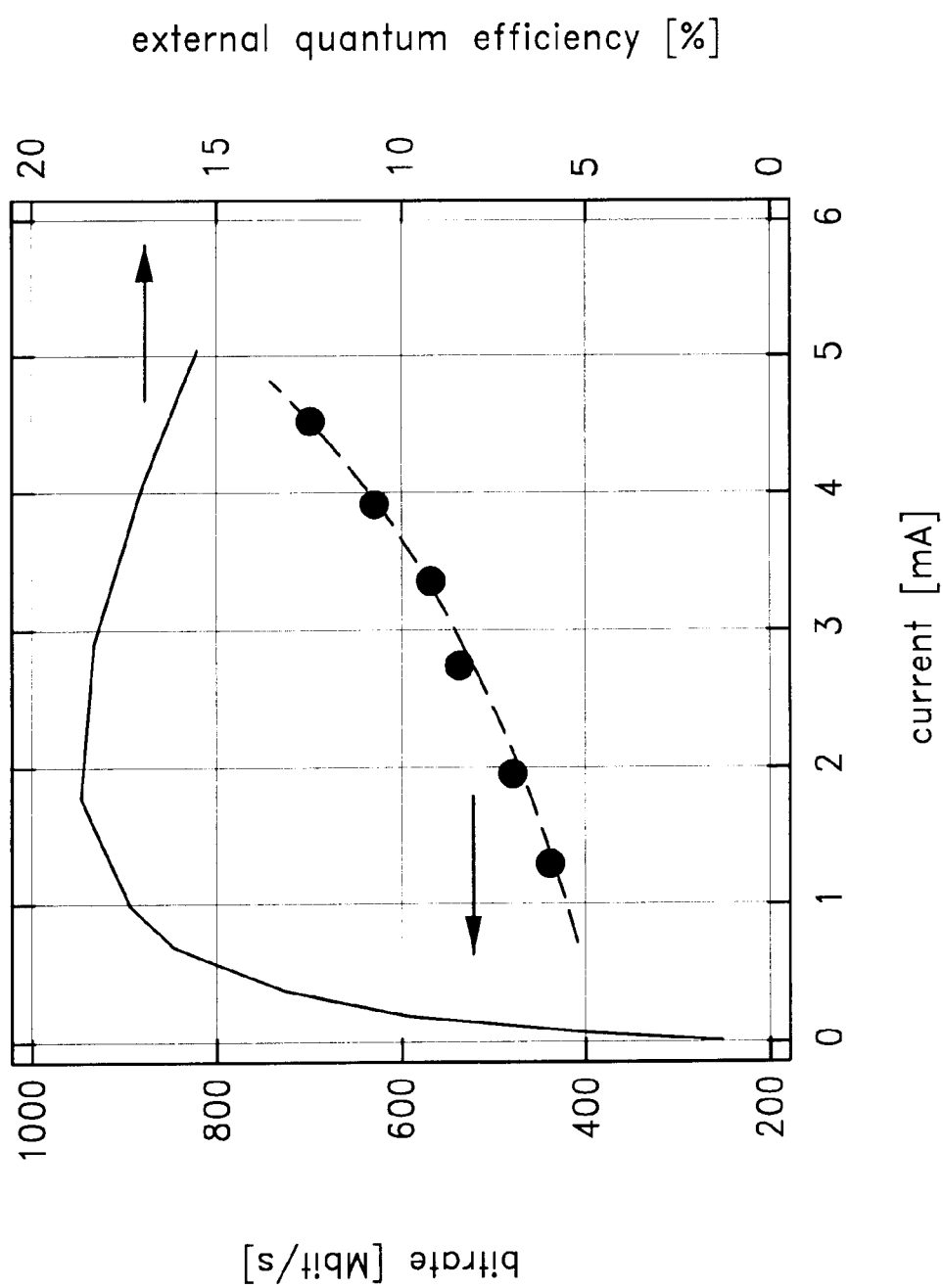

Next, eye diagrams are studied, taken by pulsing the LED of the invention between two voltages such that rise and fall times are comparable with a pseudo-random bit stream of $2^{23}$ −1 bits. For every high-level voltage, there is maximum frequency at which the eye starts to close. The acceptable limit of the open eye was defined as shown on FIG. 23 as the eye where the sum of the amplitude scatter of the upper and lower light levels is about equal to the open amplitude. FIG. 24 shows the maximum bit rate of operation according to this definition as a function of the high-state quasi-static current. As expected, the bit rate increases with increasing high-state quasi-static current. The external quantum efficiency as a function of current of this same device is plotted on the right axis of FIG. 24. The drop in efficiency for currents beyond the maximum efficiency is small. This is particularly relevant for high-speed interconnects, because it implies that higher speeds can be accessed by increasing the current without severe penalty in efficiency. For example, it can be seen that a bit rate of 622 Mbit/s is reached at a high-state current of about 3.9 mA and that the corresponding external quantum efficiency is still more than 17%, or 0.24 mW/mA. This is much higher than the efficiency reached at comparable bit rates with normal LEDs (see *Applied Physics Letters* Vol. 60, p. 353, (1992): "Doping concentration dependence of radiation and optical modulation bandwidth in carbon-doped $Ga_{0.51}In_{0.49}P$/GaAs light-emitting diodes grown by gas source molecular beam epitaxy" by T. J. de Lyon, J. M. Woodall, D. T. McInturff, R. J. S. Bates, J. A, Kash, P. D. Kirchner and F. Cardone) or RC-LEDs (see *IEEE Journal of Lightwave Technology*, Vol. 14, p. 1721–1729 (1996): "Temperature and modulation characteristics of resonant-cavity light-emitting diodes" by E. F. Schubert, N. E. J. Hunt, R. J. Malik, M. Micovic and D. L. Miller). It is also interesting to note from FIG. 24 that over 400 MBit/s can be reached at sub-mA current levels, and the external quantum efficiency at 1 mA is more than 17%.

The devices of the present invention do not rely on a resonance for their operation, and their performance is not critical impacted by variations in growth and process. They are therefore suitable for integration into large arrays. Furthermore, they exhibit high efficiency characteristics, in particular at high speed.

ALTERNATE EMBODIMENT OF THE INVENTION

According to another aspect of the present invention, a large-area light emitting device or diode is disclosed that includes advantageous aspects of the invention. One of the characteristics of this large-area light emitting device is that it aims to avoid that light rays that are conducted laterally in the waveguides formed between the different interfaces inside a light-emitting device or diode are lost. The layer structure of many semiconductor light-emitting devices or diodes indeed consists of multiple layers of different semiconductor materials with different refractive indices. Therefore, light can get trapped inside waveguides formed between these materials. This light can escape from the semiconductor from the side of the semiconductor crystal. By packaging the diode in a reflective cup, this light can be re-oriented to the direction perpendicular to the main surface of the diode crystal.

However, during the light propagation in the waveguides, a significant amount of the photons can be re-absorbed in the semiconductor crystal.

In order to avoid this re-absorption, it is advantageous to have structures that allow the laterally guided light to escape from the semiconductor from the main surface close to the place where the light is generated.

It is an aim of the present invention of large-area light-emitting devices to propose a structure for a light-emitting diode that allows outcoupling of guided waves over short distances in the semiconductor. The proposed structure results in a large-area planar diode that can be made over a large range of sizes. The large-area LED comprises a multitude of small light-emitting diodes. These smaller diodes can be disposed in any configuration such as a one-dimensional or, preferably, a two-dimensional array configuration. Due to the separation in individual small light-emitting diodes, the lateral waveguiding that normally occurs in a large light-emitting diode is avoided: laterally guided modes can be coupled out through the top surface of the diode. In a large-area diode comprising a multitude of smaller diodes, the totally emitted power simply scales with the area of the total diode, or with the number of small diodes included. Redesign of a large-area diode according to specifications of total light output power is hence simplified.

Figure 25:
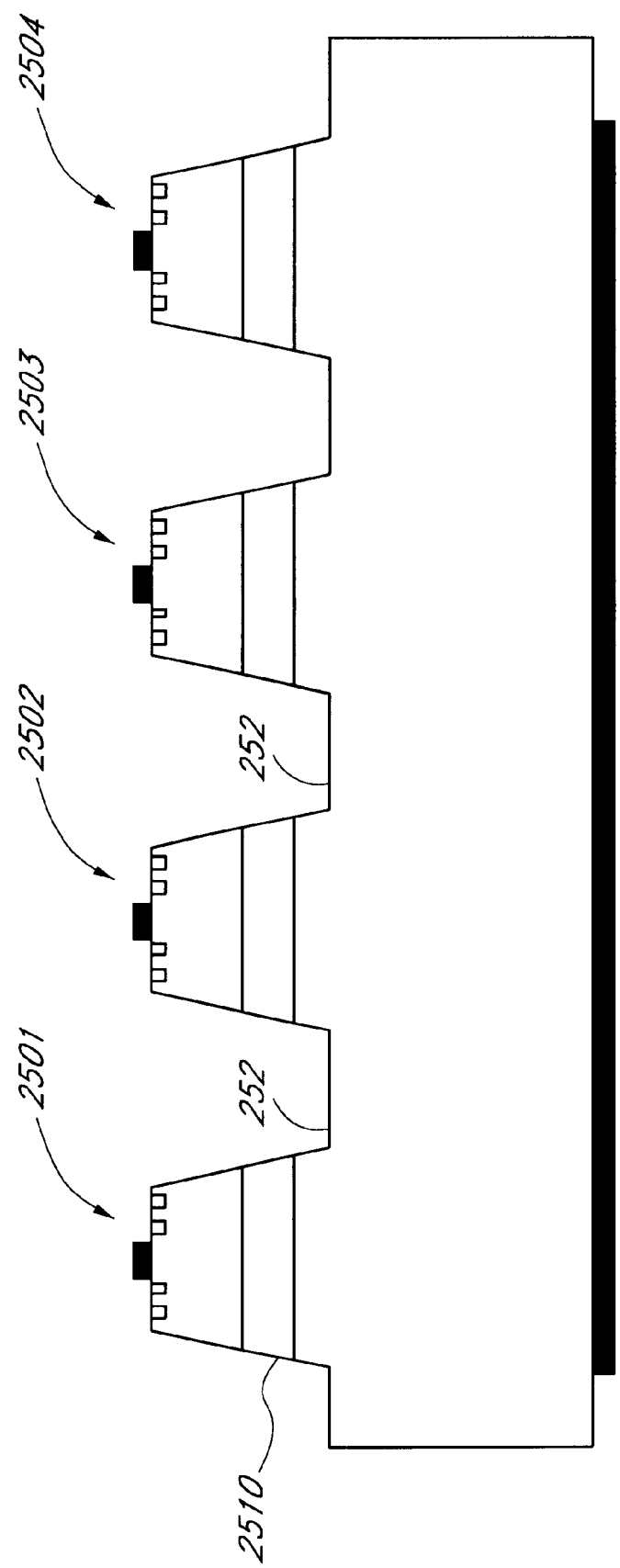
FIG. 25 is representing a large-area LED according to one preferred embodiment, wherein the outcoupling of the laterally guided modes occurs at the mesa edges and wherein the mesa is etched through the active layer.
Figure 26:
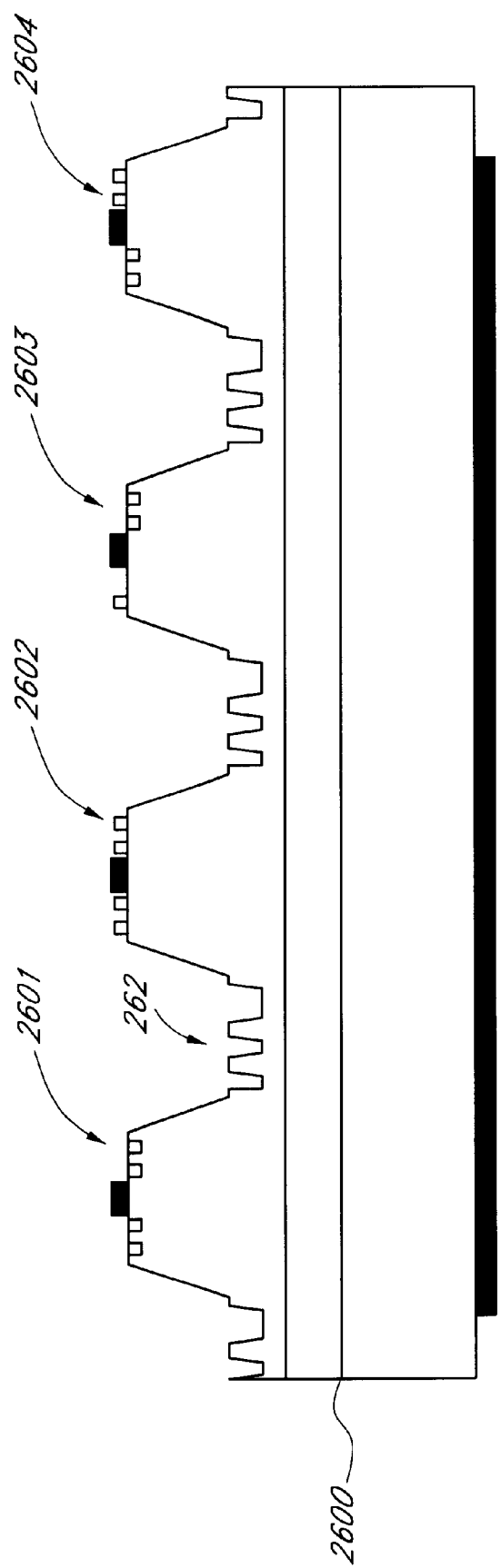
FIG. 26 is representing another preferred embodiment of a large-are LED wherein the outcoupling of the laterally guided modes occurs by the textured area between the mesas of the large-area LED.

Two embodiments of this aspect of the invention are shown in FIG. 25 and FIG. 26, respectively. In FIG. 25, the individual light-emitting devices or diodes (2501) (2502) (2503) (2504) are separated by a mesa etch that reaches through the active layer (2510), such that laterally guide modes can escape from the semiconductor at the mesa edge. To enhance the outcoupling efficiency, the preferred embodiment of this diode has at least one of its main surfaces textured. In the embodiment shown in FIG. 26, the mesa that isolates the individual diodes do not reach to the active layer (2610). To couple out the laterally waveguided light, the surface of the LED between the individual diodes is textured (262).

Preferably, the light-emitting devices or diodes of the large-area diode of the present invention are thin-film diodes. The total semiconductor film thickness is thin enough such as not to absorb more than 10% of a beam that propagates perpendicularly to the main diode surface. One surface of the diode is preferably mirror-like, and the light is coupled out through the opposite surface. The mesas of the embodiments shown in FIGS. 25 and 26 can be formed either from the mirror-like surface or from the light-emitting surface. If the semiconductor substrate on which the light-emitting diode layers are grown is not sufficiently transparent for the light, the original substrate can be removed and a transparent carrier can be used. This transparent carrier can be provided at the side of the original substrate or at the opposite side.

In a particular embodiment, the transparent carrier is a foil of material such as a polymeric material. In this case, a phosphor can be incorporated into the foil to change the wavelength of the diode. A backside mirror can be provided or omitted. In the latter case, a two-colour diode in which the front side and the back side emit different colours is created.

Figure 27:
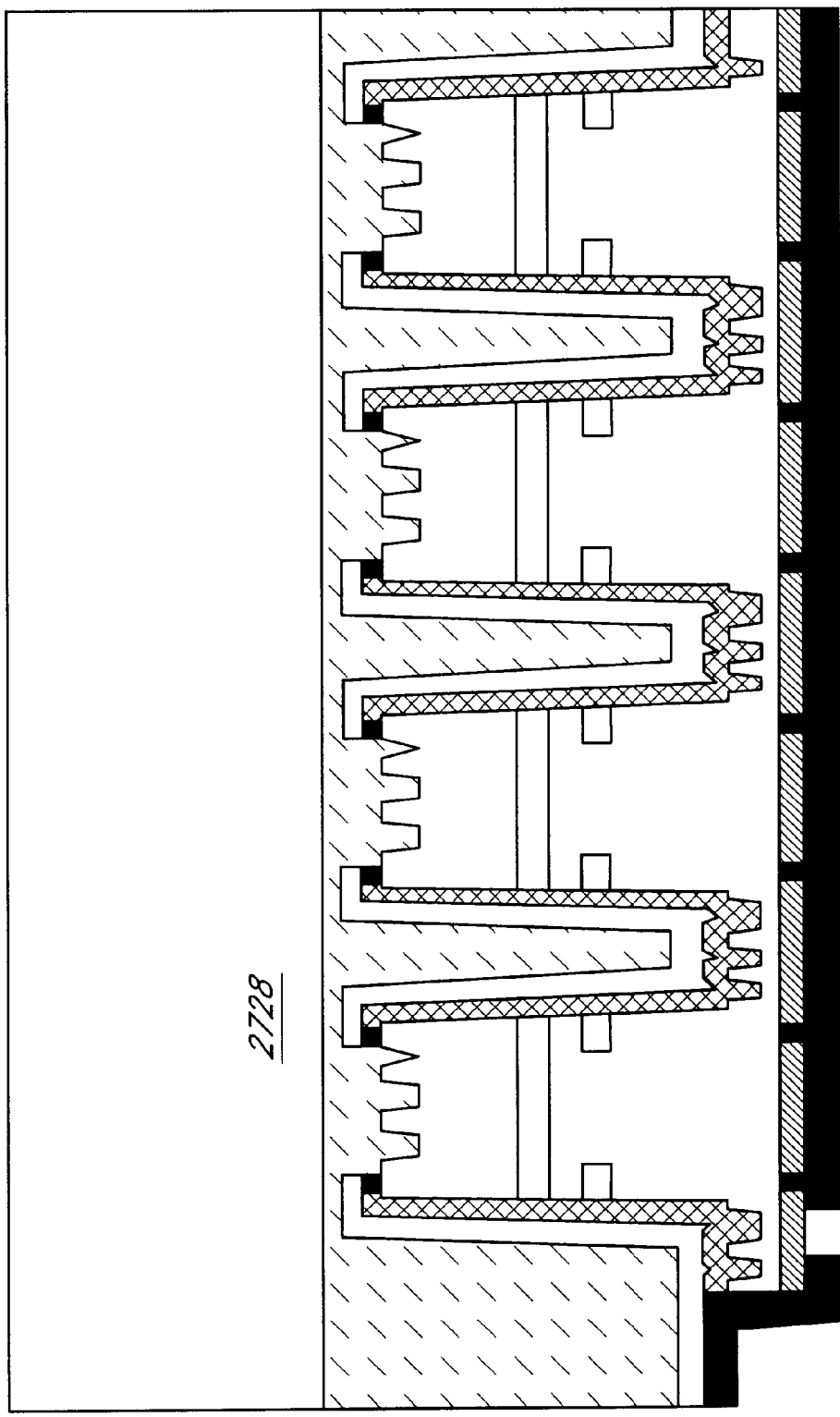
FIG. 27 is representing a cross-section view wherein a large-area LED is shown with its textured surface.

A preferred embodiment of the thin-film large-area diode according to this aspect of the invention is shown in FIG. 27. The figure shows a one-dimensional cross-section of a one or two-dimensional array of smaller diodes, together constituting one large-area diode. A carrier of transparent material (2728) is placed on top of the mesas, and the light is coupled out of the diode through this transparent material.

The semiconductor material is thinned down. The side opposite to the transparent carrier can be covered with a mirror (2729). In a particular embodiment, the top surface can be textured, such as to enhance the light outcoupling efficiency. Use can also be made of an oxidised AlGaAs layer to confine the current and hence the light generation to the center region of each smaller diode.

Figure 28:
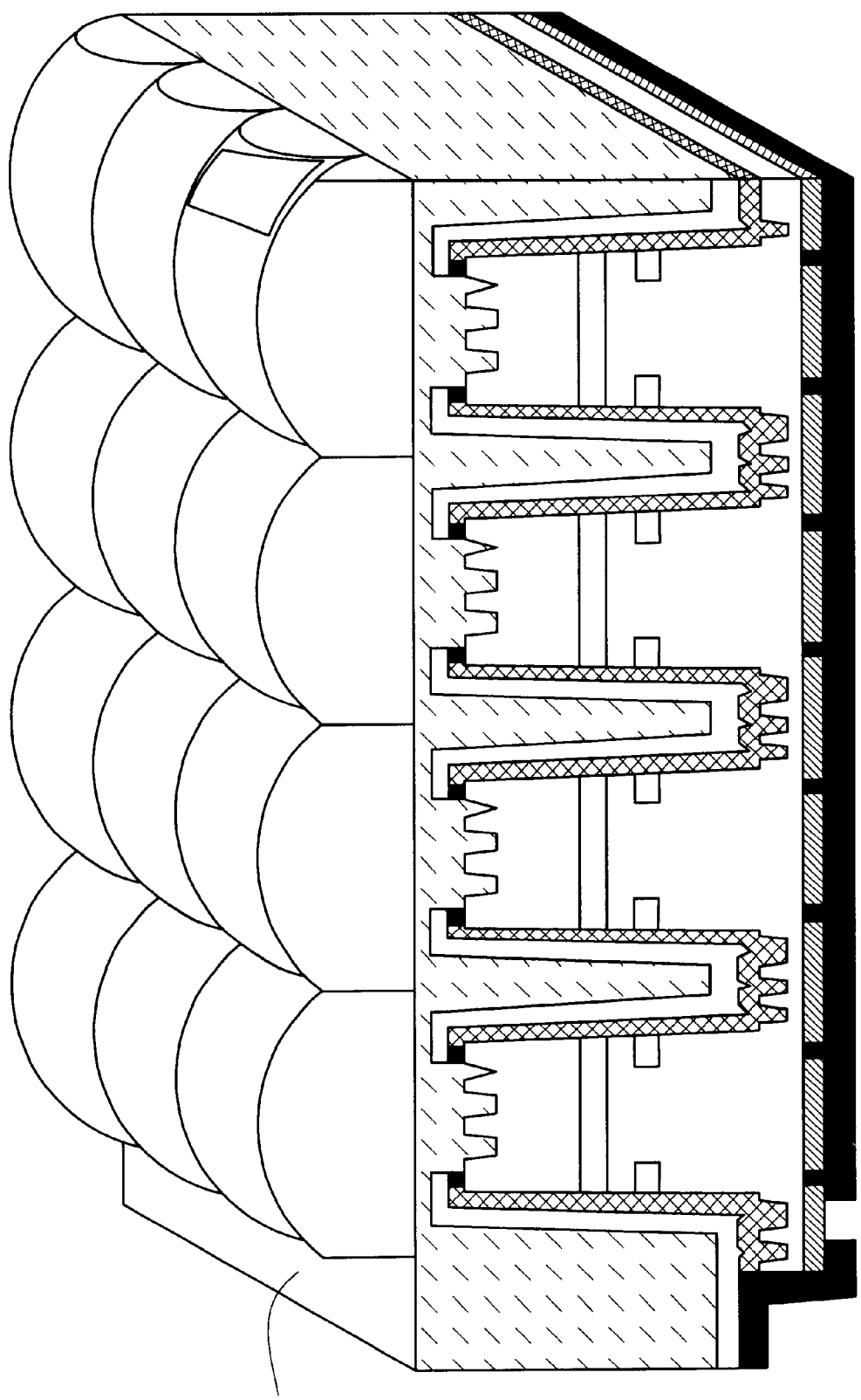
FIG. 28 is representing another preferred embodiment of a large-area LED with textured surface wherein microlenses are associated to the diodes of the array.

In another embodiment of the large-area light emitting device, each individual small diode is equipped with a microlens. The resulting large-area diode is quasi-planar, and yet has all the benefits of a microlensed large-area diode, such as more efficient outcoupling of the light and optimised desired beam profile. The microlenses can formed on the small diodes on wafer level, in contrast to the lenses of state-of-the-art large-area diodes, which have to be formed during packaging. If the transparent carrier is a polymeric material, a way to form the microlenses is embossing them directly into this polymeric carrier (2828). This is exemplified in FIG. 28. This figure shows at the front a cross-section through a two-dimensional array of small diodes, together constituting one large-area diode. As for the non-microlensed large-area diode consisting of a multitude of smaller diodes, the total light output power is the sum of the output powers of the individual diodes, each equipped with their individual microlens. Re-design of a large-area diode to a specified output power level is therefore facilitated.

In the embodiments shown in FIGS. 25 to 28, the smaller diodes constituting the large-are diode are shown to be connected electrically in parallel. The voltages over the smaller diodes are essentially identical, and the current of the large-area diode is the sum of the currents through the individual smaller diodes. In another embodiment of this aspect of the invention, the large-area diode can consist of an array of smaller diodes that are connected electrically in series. The current through the large-area diode is then essentially equal to the current through the individual smaller diodes, whereas the voltage over the large-area diode is equal to the sum of the voltages over the individual small-area diodes. This total voltage can be made equal to a voltage standard such as 110 V or 230 V.

What is claimed is:

1. A device for emitting radiation at a predetermined wavelength, said device comprising a cavity with an active layer wherein said radiation is generated by charge carrier recombination, said cavity having a radiation confinement space including confinement features for said charge carriers, and said device comprising at least one edge having a substantially random diffraction grating structure.

2. The device as recited in claim 1, wherein the substantially random grating structure is a regular repetition of a random grating.

3. The device as recited in claim 1 further including a waveguide.

4. The device as recited in claim 3, wherein said edge having a substantially random grating structure is extending as at least one edge of said waveguide forming part of said device, and wherein said edge preferably is abutting or extending in said active layer.

5. The device as recited in claim 3 wherein said edge having a substantially random grating structure is extending as at least one edge of said waveguide forming part of said device, and wherein said edge preferably is abutting or extending in said radiation confinement space.

6. The device as recited in claim 3 wherein said edge having a substantially random grating structure is extending as at least one edge of said waveguide forming part of said device, and wherein said edge preferably is abutting or extending to said confinement features for said charge carriers.

7. The device as recited in claim 3 wherein said edge having a substantially random grating structure is extending as at least one edge of said waveguide forming part of said device, and wherein said edge preferably is abutting or extending in said cavity.

8. The device as recited in claim 1, wherein said cavity comprises at least one mesa edge for defining said radiation confinement space.

9. The device as recited in claim 1 wherein said radiation confinement space is confining said charge carriers to a subspace being smaller than the radiation confinement space within said cavity.

10. The device as recited in claim 1, having a charge carrier confinement feature made of a dielectric material.

11. The device as recited in claim 10, wherein said charge carrier confinement feature made of a dielectric material is a ring and wherein said device is mounted on a carrier substrate, said carrier substrate preferably being transparent for said radiation and more preferably including a fiber optic face plate.

12. A device for emitting radiation at a predetermined wavelength, said device comprising a cavity with an active layer wherein said radiation is generated by charge carrier recombination, said cavity having a radiation confinement space including confinement features for said charge carriers, said device comprising at least two edges forming in cross-section a substantially triangular shape and an angle between said edges being smaller than 45° and at least one of said edges having a transparent portion, and at least one of said edges having a substantially random diffraction grating structure.

13. The device as recited in claim 12, wherein one of the two edges of said cavity is transparent for said radiation and one of the two edges is reflective and wherein the edges are at least adjacent or abutting one to another.

14. The device as recited in claim 13, wherein at least one of the two edges has a roughened surface condition.

15. An array of devices for emitting radiation at a predetermined wavelength, wherein each device comprises a cavity with an active layer generating radiation by charge carrier recombination, said cavity having a radiation confinement space including confinement features for said charge carriers and at least one edge having a substantially random diffraction grating structure, and wherein individual devices of said array are individually controllable.

16. The array of devices as recited in claim 15, wherein the individual devices of said array are being defined with a mesa edge, and wherein grooves between the individual devices have a substantially random diffraction grating structure.

17. The array of devices as recited in claim 15, wherein the individual devices have a common anode and a common cathode contact.

18. The array of devices as recited in claim 15, wherein essentially each device has a microlens mounted thereon.

19. The array of devices as recited in claim 15 being mounted on a polymeric foil carrier.

20. The array of devices as recited in claim 19, wherein said polymeric foil further has a radiation converting phosphorous layer thereon, said device emitting thereby light of a different wavelength at a side where the device is mounted to said polymeric foil carrier compared to a side of the device opposite said polymeric foil carrier.

21. A device for emitting radiation at a predetermined wavelength, said device having a cavity with an active layer wherein said radiation is generated by charge carrier recombination, said device including a waveguide and said device comprising at least one edge having a substantially random diffraction grating structure.

22. The device as recited in claim 21, wherein the substantially random grating structure is a regular repetition of a random grating.

23. The device as recited in claim 22, wherein said edge having a substantially random grating structure is extending as at least one edge of said waveguide forming part of said device, and wherein said edge preferably is abutting or extending in said active layer.

24. The device as recited in claim 22, wherein said edge having a substantially random grating structure is extending as at least one edge of said waveguide forming part of said device, and wherein said edge preferably is abutting or extending in said radiation confinement space.

25. The device as recited in claim 22, wherein said edge having a substantially random grating structure is extending as at least one edge of said waveguide forming part of said device, and wherein said edge preferably is abutting or extending to said confinement features for said charge carriers.

26. The device as recited in claim 22, wherein said edge having a substantially random grating structure is extending as at least one edge of said waveguide forming part of said device, and wherein said edge preferably is abutting or extending in said cavity.

27. The device as recited in claim 21 wherein said cavity is having a radiation confinement space including confinement features for said charge carriers.

28. The device as recited in claim 27, wherein said cavity comprises at least one mesa edge for defining said radiation confinement space.

29. The device as recited in claim 27 wherein said radiation confinement space is confining said charge carriers to a subspace being smaller than the radiation confinement space within said cavity.

30. The device as recited in claim 29, having a charge carrier confinement feature made of a dielectric material.

31. The device as recited in claim 30, wherein said charge carrier confinement feature made of a dielectric material is a ring and wherein said device is mounted on a carrier substrate.

32. The device as recited in claim 30, wherein said charge carrier confinement feature made of a dielectric material is a ring, and wherein said device is mounted on a carrier substrate, said carrier substrate being transparent for said radiation.

33. The device as recited in claim 30, wherein said charge carrier confinement feature made of a dielectric material is a ring, and wherein said device is mounted on a carrier substrate, said carrier substrate being transparent for said radiation and including a fiber optic face plate.

34. A device for emitting radiation at a predetermined wavelength, said device having a cavity with an active layer wherein said radiation is generated by charge carrier recombination, said device including a waveguide and said device comprising two edges forming in cross-section a substantially triangular shape and an angle between said edges being smaller than 45°, at least one of said edges having a transparent portion and at least one edge having a substantially random diffraction grating structure.

35. The device as recited in claim 34, wherein one of the two edges of said cavity is transparent for said radiation and one of the two edges is reflective and wherein the edges are at least adjacent or abutting one to another.

36. The device as recited in claim 35, wherein at least one of the two edges has a roughened surface condition.

37. An array of devices wherein individual devices of said array have a cavity with an active layer wherein said radiation is generated by charge carrier recombination, said individual devices include a waveguide and comprise at least one edge having a substantially random diffraction grating structure, and wherein individual devices of said array are individually controllable.

38. The array of devices as recited in claim 37 having a common anode and a common cathode contact.

39. The array of devices as recited in claim 37, essentially each device having a microlens thereon.

40. The array of devices as recited in claim 37 being mounted on a polymeric foil carrier.

41. An array of devices wherein individual devices of said array have a cavity with an active layer wherein said radiation is generated by charge carrier recombination, said individual devices include a waveguide and comprise at least one edge having a substantially random diffraction grating structure, wherein said individual devices are individually controllable by being defined with a mesa edge, and wherein grooves in between the individual devices have a substantially random diffraction grating structure.

42. An array of devices for emitting radiation at a predetermined wavelength, wherein each device has a cavity with an active layer wherein said radiation is generated by charge carrier recombination, a waveguide and at least one edge having a substantially random diffraction grating structure, and wherein the devices of said array are individually controllable, said array being mounted on a polymeric foil carrier having a radiation converting phosphorous layer mounted thereon, said array emitting thereby light of a different wavelength at a side where the array is mounted to said polymeric foil carrier compared to a side of the array opposite said polymeric foil carrier.

43. A device for emitting radiation at a predetermined wavelength, said device having a cavity with an active layer wherein said radiation is generated by charge carrier recombination, said device comprising at least one edge having a substantially random diffraction grating structure and being mounted on a transparent carrier.

44. A device for emitting radiation at a predetermined wavelength, said device having a cavity with an active layer wherein said radiation is generated by charge carrier recombination, said device comprising at least one edge having a substantially random diffraction grating structure and having at least one reflective edge, at least one of the electrical contacts to said device being through said reflective edge.

45. The device as recited in claim 44 being mounted on a transparant carrier.

46. A device for emitting radiation at a predetermined wavelength, said device comprising at least two edges forming in cross-section a substantially triangular shape and the angle between said edges being smaller than 45° and at least one of said edges having a transparent portion.

47. The device as recited in claim 46, wherein one of the two edges of said cavity is transparent for said radiation and one of the two edges is reflective and wherein the edges are at least adjacent or abutting one to another.

48. The device as recited in claim 46, wherein at least one of the two edges has a roughened surface condition.

49. An array of devices for emitting radiation at a predetermined wavelength, said devices comprising a cavity with an active layer wherein said radiation is generated by charge carrier recombination, and wherein individual devices of said array are individually controllable and wherein waveguides exist between the individual devices, said waveguides having a substantially random diffraction grating structure.

50. A device for emitting radiation at a predetermined wavelength, said device comprising a cavity with an active layer wherein said radiation is generated by charge carrier recombination, said cavity having a radiation confinement space including confinement features for said charge carriers, and said device comprising at least one edge having diffraction grating structure, wherein the diffraction grating structure has a plurality of differently spaced ridges and valleys.

* * * * *